(12) United States Patent
Topaloglu et al.

(10) Patent No.: US 11,011,415 B2
(45) Date of Patent: May 18, 2021

(54) AIRGAP VIAS IN ELECTRICAL INTERCONNECTS

(71) Applicant: International Business Machines Corporation, Armonk, NY (US)

(72) Inventors: Rasit O. Topaloglu, Poughkeepsie, NY (US); Naftali Lustig, Croton on Hudson, NY (US); Matthew Angyal, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/858,484

(22) Filed: Apr. 24, 2020

(65) Prior Publication Data

US 2020/0258770 A1     Aug. 13, 2020

Related U.S. Application Data

(62) Division of application No. 16/165,251, filed on Oct. 19, 2018, now Pat. No. 10,796,949.

(51) Int. Cl.
| | | |
|---|---|---|
| *H01L 23/522* | (2006.01) | |
| *H01L 23/532* | (2006.01) | |
| *H01L 21/768* | (2006.01) | |

(52) U.S. Cl.
CPC .... *H01L 21/7682* (2013.01); *H01L 21/76802* (2013.01); *H01L 21/76829* (2013.01);
(Continued)

(58) Field of Classification Search
CPC .............. H01L 21/7682; H01L 23/5226; H01L 21/76829; H01L 21/76802; H01L 21/7685;
(Continued)

(56) References Cited

U.S. PATENT DOCUMENTS

| | | |
|---|---|---|
| 6,281,585 B1 | 8/2001 | Bothra |
| 6,841,844 B2 | 1/2005 | Hsu et al. |

(Continued)

FOREIGN PATENT DOCUMENTS

| | | |
|---|---|---|
| CN | 107731744 A | 2/2018 |
| WO | WO201806336 A1 | 4/2018 |

OTHER PUBLICATIONS

R. Brain, et al., Low-k Interconnect Stack with a Novel Self-Aligned Via Patterning Process for 32 nm High Volume Manufacturing, 2009 IEEE International Interconnect Technology Conference, pp. 249-251.

(Continued)

*Primary Examiner* — David Vu
(74) *Attorney, Agent, or Firm* — Steven Meyers; L. Jeffrey Kelly; Lou_Percello, Attorney, PLLC

(57) ABSTRACT

Multiple interconnect structures with reduced TDDB susceptibility and reduced stray capacitance are disclosed. The structures have one or more pairs of layers (an upper and a lower layer) that form layered pairs in the structure. In each of the upper and lower layers, dielectric material separates an upper pair of interconnects from a lower pair of interconnects or from other conductive material. Pairs of vias pass through the dielectric and mechanically and electrically connect the respective sides of the upper and lower sides of the interconnect. A gap of air separates all or part of the pair of vias and the electrical paths the vias are within. In alternative embodiments, the airgap may extend to the bottom of the vias, below the tops of the lower pair of interconnects, or deeper into the lower layer. Alternative process methods are disclosed for making the different embodiments of the structures.

20 Claims, 20 Drawing Sheets

(52) U.S. Cl.
CPC ...... *H01L 23/5226* (2013.01); *H01L 21/7685* (2013.01); *H01L 21/76877* (2013.01); *H01L 23/53295* (2013.01)

(58) Field of Classification Search
CPC ......... H01L 23/53295; H01L 21/76877; H01L 23/5222; H01L 21/76834; H01L 21/76832; H01L 21/76849; H01L 21/76807
See application file for complete search history.

(56) References Cited

U.S. PATENT DOCUMENTS

| | | | |
|---|---|---|---|
| 7,056,822 B1 | 6/2006 | Zhao | |
| 7,138,329 B2* | 11/2006 | Lur | ................. H01L 21/7682 438/619 |
| 9,431,294 B2 | 8/2016 | He et al. | |
| 9,583,383 B2 | 2/2017 | Wu et al. | |
| 9,831,174 B1 | 11/2017 | Zhang et al. | |
| 2003/0073302 A1 | 4/2003 | Huibers | |
| 2017/0256485 A1 | 9/2017 | Tagami | |
| 2017/0330832 A1 | 11/2017 | He et al. | |

OTHER PUBLICATIONS

Appendix P: IBM Patents or Patent Applications Treated as Related.

\* cited by examiner

AIRGAP VIAS IN ELECTRICAL INTERCONNECTS

BACKGROUND

Two major concerns for semiconductor interconnect structures made by Back End of the Line (BEOL) processes are Time Dependent Dielectric Breakdown (TDDB) and stray capacitance.

TDDB may take place at the shortest distance between nearby metal interconnects and via configurations where dielectric in the structure is thinnest. Contrary to breaking down the dielectric immediately. TDDB occurs over time, deteriorating the dielectric by extended exposure to an electric field, ultimately resulting in a current path that can lead to failure of the interconnecting structures of the circuitry.

Stray capacitance is introduced when conductors with a voltage difference are separated by a distance, causing an electric field within any material disposed within the separation. Therefore, using materials with a low dielectric constant to electrically insulate conductors in connecting structures is important for reducing stray capacitance.

In the BEOL, devices/structures are interconnected with multiple metal layers that make up horizontal and vertical (e.g. via) electrical connections which are electrically separated by insulating materials, e.g. dielectrics.

As technology advances, the line widths and spacing of these connections becomes smaller, e.g. shrinking from 32 nanometer (nm) line and space in the 14 nm technology node down to 20 nm line and space in the 7 nm node. While dielectric thicknesses between conductors decrease the voltages across the dielectric, and resulting electric fields, tend to remain high or even increase. Accordingly, the TDDB effects become more challenging. Particularly, areas around and under via penetrations that come close to metal layers are increasingly prone to TDDB failure.

Stray capacitance also increases as the thickness between the conductors decreases. Therefore, stray capacitance in these smaller interconnecting structures becomes more of a problem. These stray capacitances can degrade signal quality and cause noise and cross talk in the circuitry.

SUMMARY

Multiple interconnect structures with reduced TDDB susceptibility and reduced stray capacitance are disclosed. The structures have one or more pairs of layers (an upper and a lower layer) that form layered pairs in the structure. Dielectric material separates an upper pair of interconnects in the upper layer from a lower pair of interconnects in the lower layer or from other conductive material. The upper and lower interconnects can be conductive lines. The upper pair of interconnects is separated by an upper separation distance and the lower pair of interconnects is separated by a lower separation distance. The center lines of the upper and lower separation distances may be offset by an offset distance. Pairs of vias pass through the dielectric and mechanically and electrically connect the respective sides of the upper and lower sides of the interconnects. A gap of air separates all or part of the pair of vias and the electrical paths the vias are within. In alternative embodiments, the airgap may extend to the bottom of the vias, below the tops of the lower pair of interconnects, or deeper into the lower layer. Alternative process methods are disclosed for making the different embodiments of the structures.

BRIEF DESCRIPTION OF THE DRAWINGS

FIGS. 16-18, and extends the bottom of the airgap into the dielectric of the lower layer, as shown in the structure of FIG. 3.

DETAILED DESCRIPTION

Figure 1:
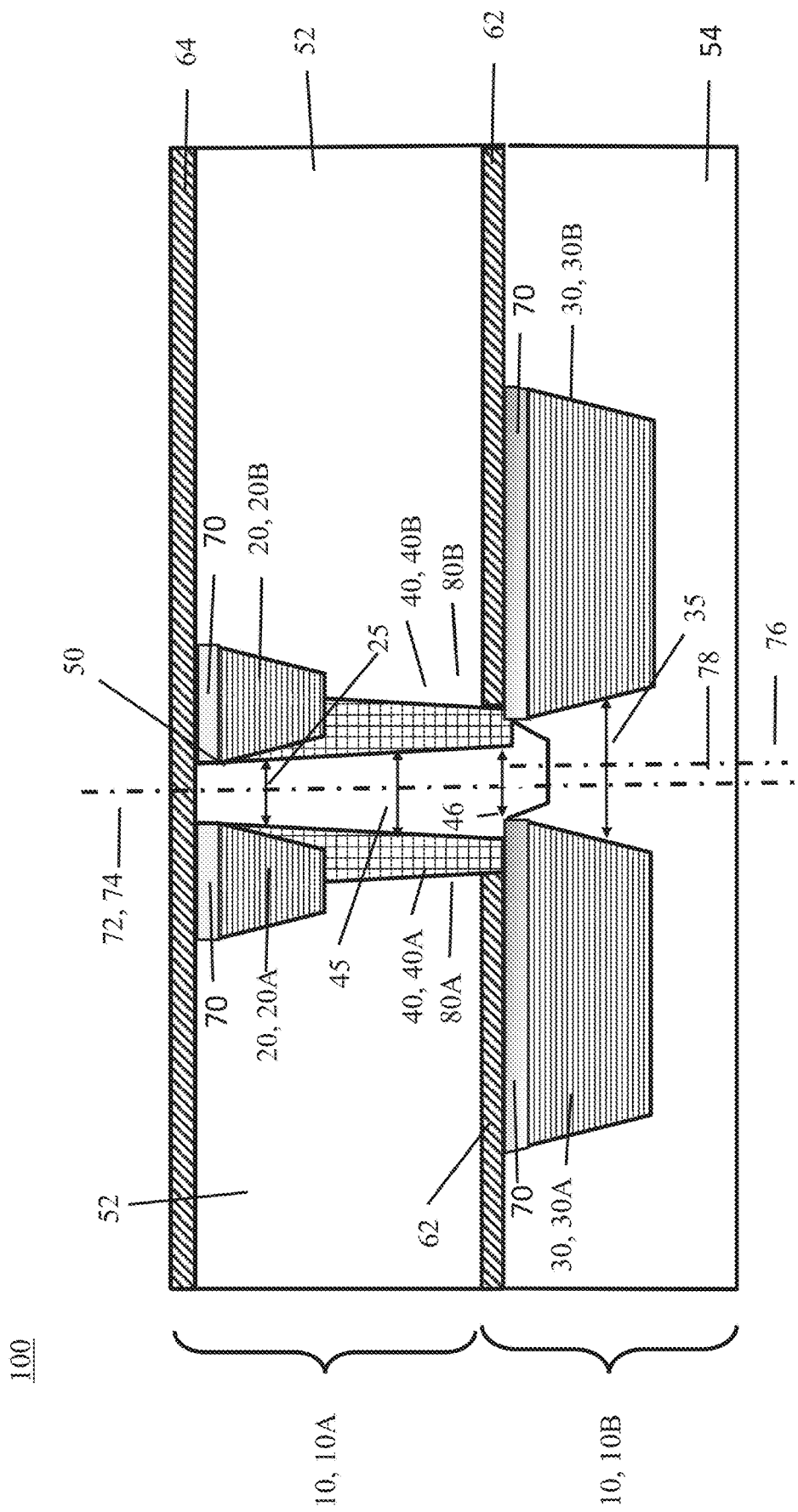
FIG. 1 shows a preferred embodiment of an interconnect structure where the novel airgap extends into the lower layer dielectric, in the presence of an offset distance (misalignment) between the upper and lower levels.

The descriptions of the various embodiments of the present invention are presented for purposes of illustration and are not intended to be exhaustive or limited to the embodiments disclosed. In addition, the Figure features are not drawn to scale and not meant to be exact dimensions for physical manufacturing. Given this disclosure, many modifications and variations of the invention will be apparent to those of ordinary skill in the art, without departing from the scope and spirit of the described embodiments. The terminology used herein was chosen to best explain the principles of the embodiments, the practical application, or technical improvement over technologies found in the marketplace, or to enable others of ordinary skill in the art to understand the embodiments disclosed herein.

The present invention will now be described with reference to the attached drawings, wherein like reference numerals are used to refer to like elements throughout. Unless otherwise stated, the reference numbers described in one or more Figures have the same description where they appear in other Figures with no explanation.

The invention relates to structures, methods, and techniques used in forming vias separated by airgaps, or in alternative embodiments vacuums. In preferred embodiments, the gap separated vias are used in interconnect structures but could be incorporated in any circuit where vias are used. Throughout this disclosure, the gap will be described as an airgap without the intent to limit the fluid in the gap to air. For example, the gap could be a vacuum, if made and sealed with a process within a vacuum.

Air has a lower permittivity than dielectrics and as such, having air within the gap between the vias reduces the stray capacitance between the vias and the electrical connections the vias are in.

Alternative embodiments for making these structures reuse a via pair mask structure in two different etch processes. The result of this feature is a possible reduction in mask count and the associated expense.

The disclosed structures are easily used with state of the art devices and the disclosed processes are easily incorporated in current BEOL processes.

Referring to FIG. 1 which shows one preferred embodiment of an interconnect structure 100.

The interconnect structure 100 has one or more layer pairs 10. One layer pair 10 shown in FIG. 1 comprises an upper layer 10A and a lower layer 10B. The upper layer 10A has an upper layer dielectric 52 covered by an upper barrier layer 64. The lower layer 10B has a lower layer dielectric 54 covered by a lower barrier layer 62. As will become apparent, other layers can be disposed on the barrier layers (62, 64) in alternative embodiments described below.

The interlevel dielectric (ILD) (52, 54) are non-conductive materials including: silicon dioxide, fluorinated silicon oxides or carbon doped silicon oxides; organics like polyimides, aromatic polymers, vapor-deposited parylene; and organosilicate glass (OSG) fluorosilicate glass (FSG) or other porous low-k or ultra low-k dielectric materials. These materials are applied by methods suitable for the material that are known in the industry, e.g. chemical vapor deposition (CVD) or spin on technologies.

Note that the upper layer dielectric 52 and the lower layer dielectric 54 may be of same or different type.

The upper 64 and lower 62 barrier layers comprise materials including dielectric materials with a low dielectric constant, k, like nitrided silicon carbide, SiCN, (NBloK) manufactured by Applied Materials, Inc. The barrier layers (62, 64) are typically deposited by Chemical Vapor Deposition (CVD) processes like Plasma Enhanced Chemical Vapor Deposition (PECVD.) Alternative materials include silicon nitride (SiN) films.

The upper layer 10A has an upper pair of interconnects 20 comprising a first upper interconnect 20A on one side of a gap 50 and a second upper interconnect 20B on the other side of the gap 50. The first 20A and second 20B upper interconnects have metal caps 70, e.g. made from cobalt and alloys of cobalt such as cobalt tungsten phosphorus. The metal caps have a cap top interfacing with the dielectric barrier layer 64 and a cap bottom, interfacing and electrically connected to the respective upper interconnects 20. There is a space with an upper separation distance 25 (designated as the distance within the double arrows, typically, and which will not be shown in later Figures for clarity) with an upper centerline 72 between the first 20A and second 20B upper interconnects. Each of the upper pair of interconnects 20 can be a conductive line (upper interconnect) within the connection structure 100. In a preferred embodiment, the metal caps 70 comprise conductive metal that is not easily etched by the processes that etch the material of the dielectrics 52 and 54. Therefore, the metal caps 70 can perform a masking function for the upper interconnects 20 during some of the etching steps disclosed in this invention.

The lower layer 10B has a lower pair of interconnects 30 comprising a first lower interconnect 30A on one side of the gap 50 and a second lower interconnect 30B on the other side of the gap 50. Optionally, the first 30A and second 30B lower interconnects have metal caps 70. The metal caps have a cap top, interfacing with the lower barrier layer 62, and a cap bottom, interfacing and electrically connected to the respective lower interconnects 30. There is a space with a lower separation distance 35 (designated as the distance within the double arrows, typically, and which will not be shown in later Figures for clarity) and a lower centerline 76 between the first 30A and second 30B lower interconnects. Each of the lower pair of interconnects 30 can be a conductive line (lower interconnect) within the connection structure 100.

The upper interconnects 20 and lower interconnects 30 comprise conductive material. In preferred embodiments, this includes metals like gold, silver, copper, aluminum, and tungsten.

In preferred embodiments, the lower center line 76 is parallel to the upper centerline 72. In the embodiment 100, the lower center line 76 is within in an offset distance 78 from being coincident with the upper centerline 72. An acceptable offset is defined by allowed overlay of vias to underlying interconnects in a semiconductor manufacturing process.

A pair 40 of vias, comprises a first 40A and second 40B via on either side of the gap 50 and are separated by a via separation distance 45 creating a space 45 (designated as the distance within the double arrows, typically, and which will not be shown in later Figures for clarity) in the gap 50. The vias are filled with metal and provide a vertical electrical connection between one level and one or more other levels in the interconnection structure 100. There is a via centerline 74 bisecting the via separation distance 45 which in preferred embodiments is colinear with the upper centerline 72. The first via 40A passes through the upper layer dielectric 52 and mechanically and electrically connects the first upper interconnect 20A to the first lower interconnect 30A to form a first electrical connection 80A. The second via 40B passes through the upper layer dielectric 52 and mechanically and electrically connects the second upper interconnect 20B to the second lower interconnect 30B to form a second electrical connection 80B.

The vias 40 comprise conductive material, preferably metals like gold, silver, copper, aluminum, tungsten.

The lower barrier layer 62 is interposed between and chemically isolates the first 30A and second 30B lower interconnects from the upper layer dielectric layer 52.

The upper separation distance 25 and the via separation 45 are in fluid communication forming a gap filled with air (or vacuum) which electrically separates the first 80A and second 80B electrical connection by an airgap separation distance (45, etc.) ("Fluid communication" means that the volume created by the upper separation distance 25 and the via separation 45 are open to one another so that a unified volume, e.g. airgap 50, is created enabling any fluid, e.g. air, or a vacuum to be throughout the unified volume of the airgap 50 without blockage or restriction.) In this embodiment, the airgap separation distance may vary along the axis of the airgap 50 because the offset distance 78 creates a discontinuity in the walls of the airgap 50 as one moves along the axis of the airgap 50. In this embodiment 100, the airgap has a bottom 55 (reference number shown in other Figures below) that extents into the lower dielectric, below the top of the lower interconnect pair 30.

In a preferred embodiment, the airgap separation distance is greater than 5 nm and less than 100 nm.

In some embodiments, e.g. 7 nm technology nodes, the separation 45 between conductors 80 is on the order of 20 nm. For 3 nm technology nodes, the separation 45 is on the order of 10 nm.

The center lines of the upper 72 and lower 76 separation distances between the upper 20 and lower 30 pairs of interconnects, respectively, can be offset by an offset distance 78. This unintentional misalignment between the upper 20 and lower 30 interconnect can often be there to varying extent and is due to limitations in the lithographic patterning process. The misalignment 46 between the upper airgap and lower airgap, causing the offset distance 78 in this embodiment, can cause locations in the airgap 50 that place parts of electrical connections 80B and 30A in close enough proximity to be more susceptible to TDDB (if air or vacuum were not in the airgap) and higher stray capacitance.

Some of the reasons the present invention reduces TDDB include the following:

No Cu migration out of trenches (due to defective liner barrier or moisture) into air gap is possible. For example, with an airgap there is no medium for Cu diffusion to take place in. (The presence of Cu in dielectric leads to increased leakage and eventual dielectric breakdown.)

Leakage currents (which always exist in operating conditions) are minimized. Typically, electron conduction occurs through defect states in the ILD bandgap. Prolonged leakage drives additional dielectric damage thus increase leakage, ultimately leading to breakdown. With no dielectric present in the airgap that mechanism is not operative.

Dielectric breakdown tends to first occur at the interface between the (NBLoK) cap to the ILD below it. If this interface is damaged during a previous level CMP, conduction paths can be created. Since there is only air (vacuum) within the airgap, there is no such interface in the present invention and this mechanism is shut down. The interface between layer 62 and layer 54 is where breakdown tends to initiate and become catastrophic in the presence of nearby interconnects held at different voltages. This pathway is not present between 80A and 80B or 30A and 30B in the present invention as dielectric is replaced by airgap.

Figure 2:
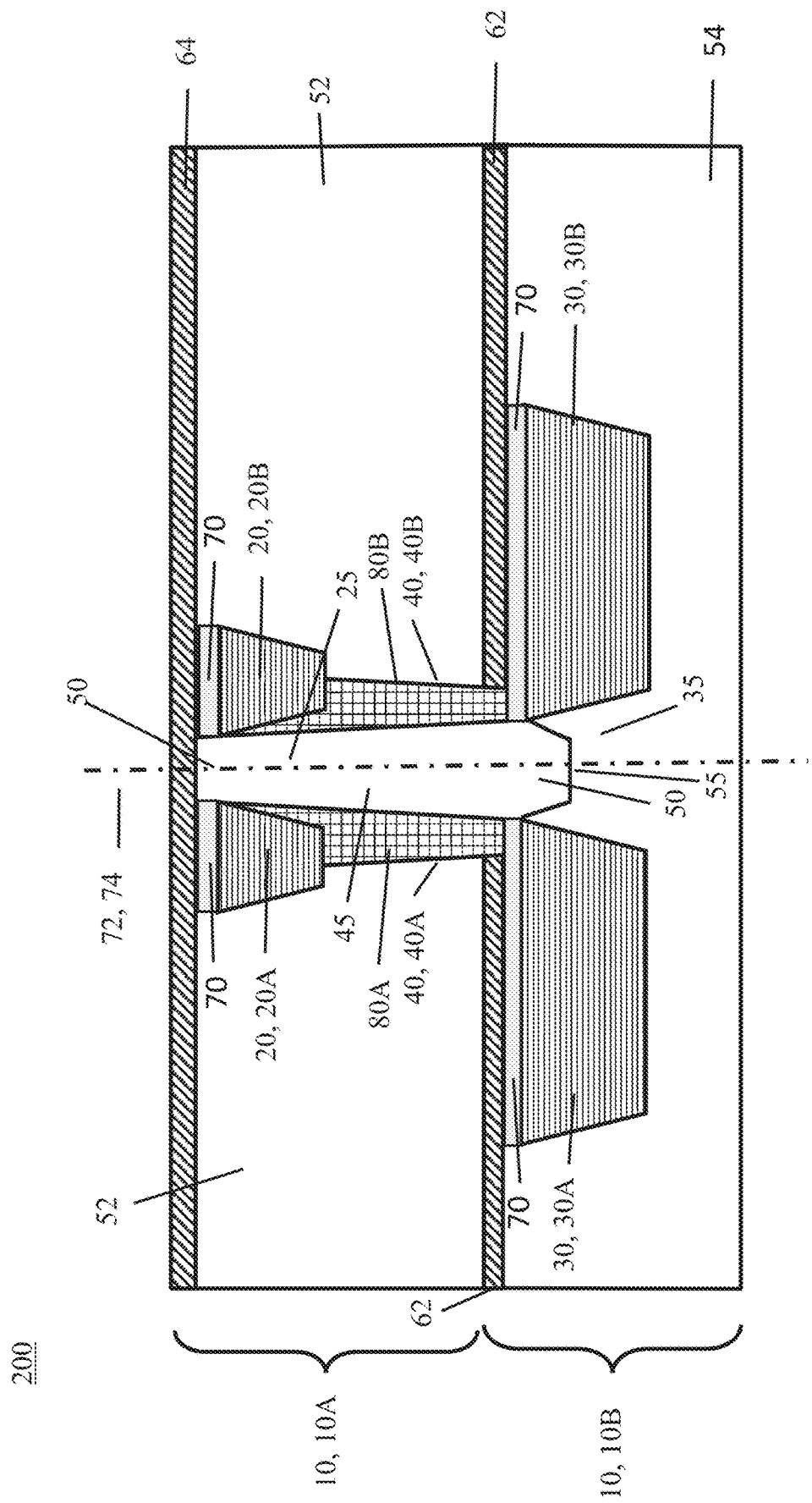
FIG. 2 shows an alternate preferred embodiment of an interconnect structure where there is no offset distance between the center lines of the upper and lower separation distances between the upper and lower pairs of interconnects, respectively.

Referring to FIG. 2 which shows an alternate preferred embodiment of an interconnect structure 200 where there is no (or negligible) offset distance 78 between the center lines of the upper 72 and lower 76 separation distances (25, 35) between the upper 20 and lower 30 pairs of interconnects. In this embodiment, the walls of the airgap 50 are more uniform and the distance between the electrical connections (80A, 80B) are easier to control. This alignment of the airgap 50 is accomplished when no misalignment is present in the lithographic processes. Note that the volume created by the separation distance 35 between the lower interconnect pair 30 and bounded by the bottom 55 of the airgap 50 is also in fluid communication with and is part of the airgap 50.

In preferred embodiments, there is no material other than the airgap and the vias between the first and second upper interconnects. Also, in preferred embodiments, there is no material other than the airgap between the first and second vias.

In one preferred embodiment, metal caps 70 are also included on the lower contacts 30 to prevent "overlay" effects. For example, the metal caps 70 being made of a material more resistant to the etching chemistry that etches the airgap 50 into the lower dielectric 54, protect the lower interconnects 30 from losing material and being damaged during the etch into the lower dielectric layer 54.

Figure 3:
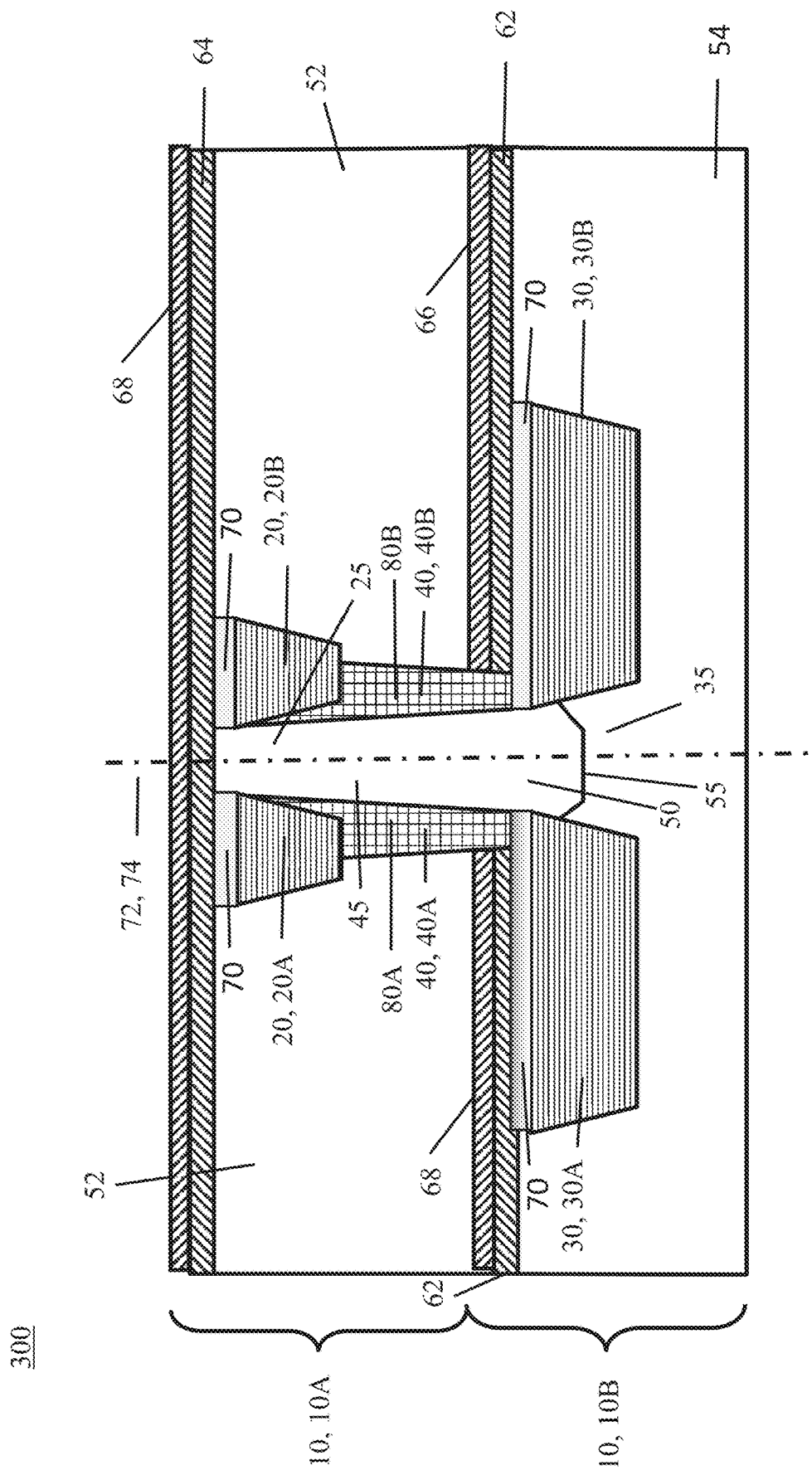
FIG. 3 shows an alternative preferred embodiment of an interconnect structure with dielectric hardmask layers separating the upper and lower layers.

Referring to FIG. 3 which shows an alternative preferred embodiment of an interconnect structure 300 with upper 68 and lower 66 dielectric hardmask layers separating the upper 10A and lower 10B layers 10 from each other and/or environments outside the layers 10.

Dielectric hardmask layers (66, 68) protect the materials below them during some of the etching steps performed to create airgap 50 and/or protect the upper 10A and lower 10A layers in the pair of layers 10 during process creating additional pairs of layers 10 in the interconnect structure (100, 300.) In preferred embodiments, the hardmask comprise SiO2 or other etch protecting materials.

Figure 4:
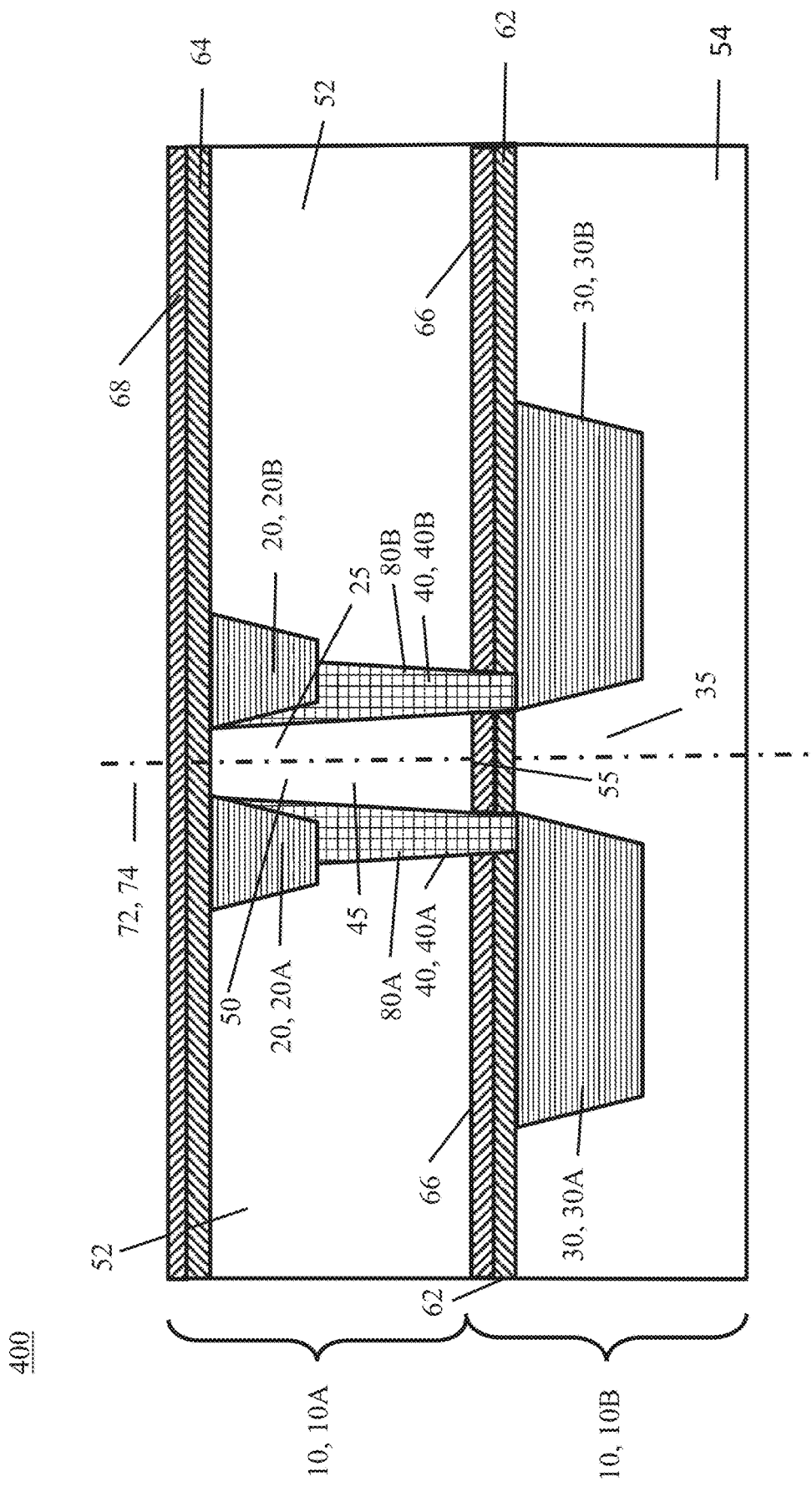
FIG. 4 shows an alternative preferred embodiment of an interconnect structure with a dielectric hardmask layer acting as an accurate stop to maintain the bottom and depth penetration of the novel airgap within the upper layer.

FIG. 4 shows an alternative preferred embodiment of an interconnect structure 400 with a lower dielectric hardmask layer 66 acting as an accurate stop to maintain the bottom 55 and depth penetration of the novel airgap 50 within the upper layer 10A. In this embodiment, the lower dielectric material 54 occupies the space defined by the lower separation distance 35 between the lower interconnects 30. In this embodiment, the metal caps 70 are optional in the lower layer 10B.

In preferred embodiments of structure 400, there is no material other than the airgap between the first and second vias, except for portions of lower barrier layer 62 and the lower dielectric hardmask layer 66.

Figure 5:
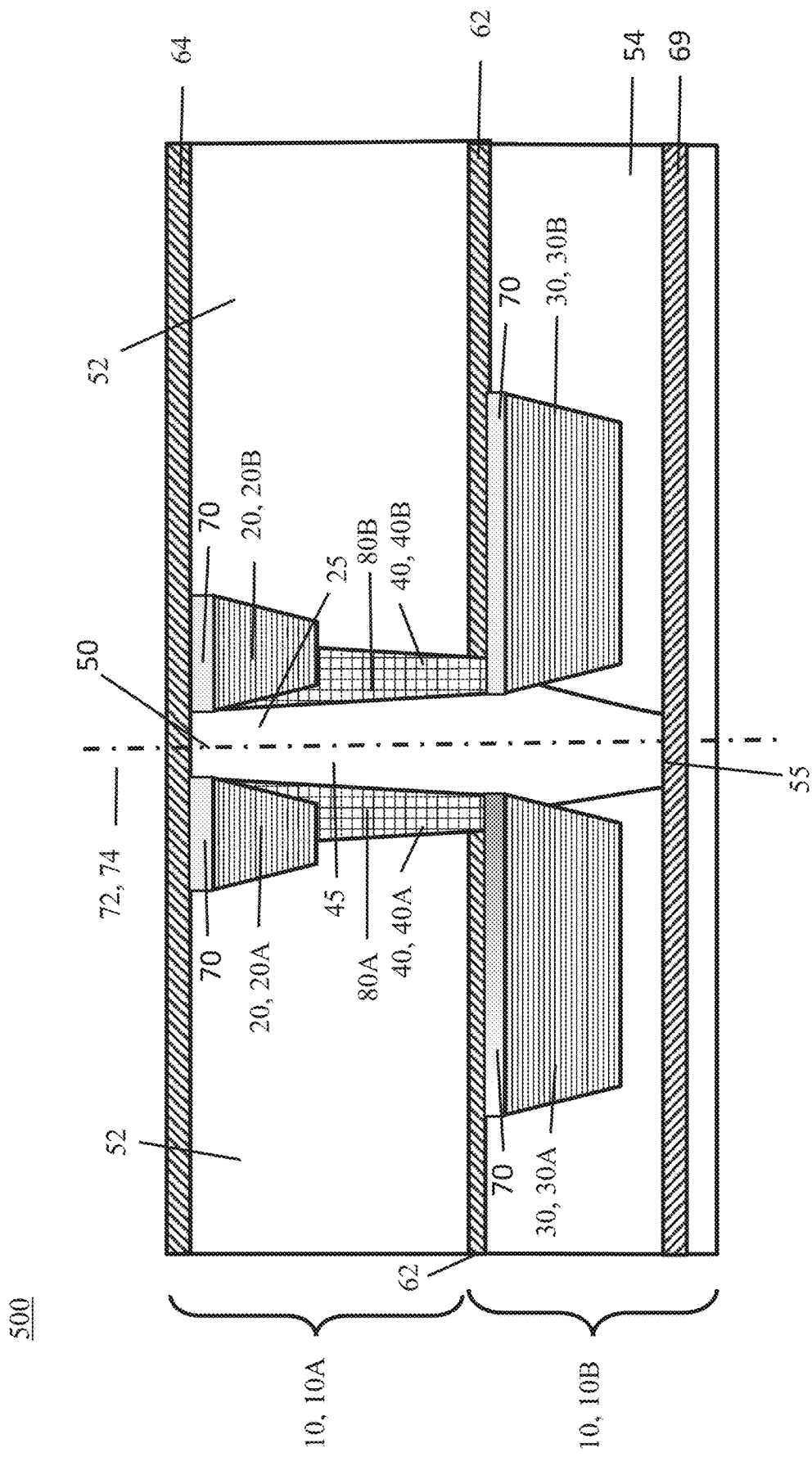
FIG. 5 shows an alternative preferred embodiment of an interconnect structure with a dielectric hardmask layer acting as an accurate stop determining the bottom depth penetration of the novel airgap into the dielectric of the lower layer.

FIG. 5 shows an alternative preferred embodiment of an interconnect structure 500 with a bottom dielectric hardmask layer 69 acting as an accurate stop determining the bottom depth penetration 55 of the novel airgap 50 into the dielectric of the lower layer 54. In this structure 500, the airgap 50 completely separates the pair of electrical interconnects (80A, 80B) from the top of the upper interconnects (20, 70) to below the bottom of the lower interconnects 30. The bottom hardmask layer 69 is incorporated into the structure during the formation of the lower dielectric 54.

FIGS. 6 through 20 show various process steps performed, and alternatives, to make the structures presented in this disclosure and other structures that will become apparent to those skilled in the art given this disclosure.

Figure 6:
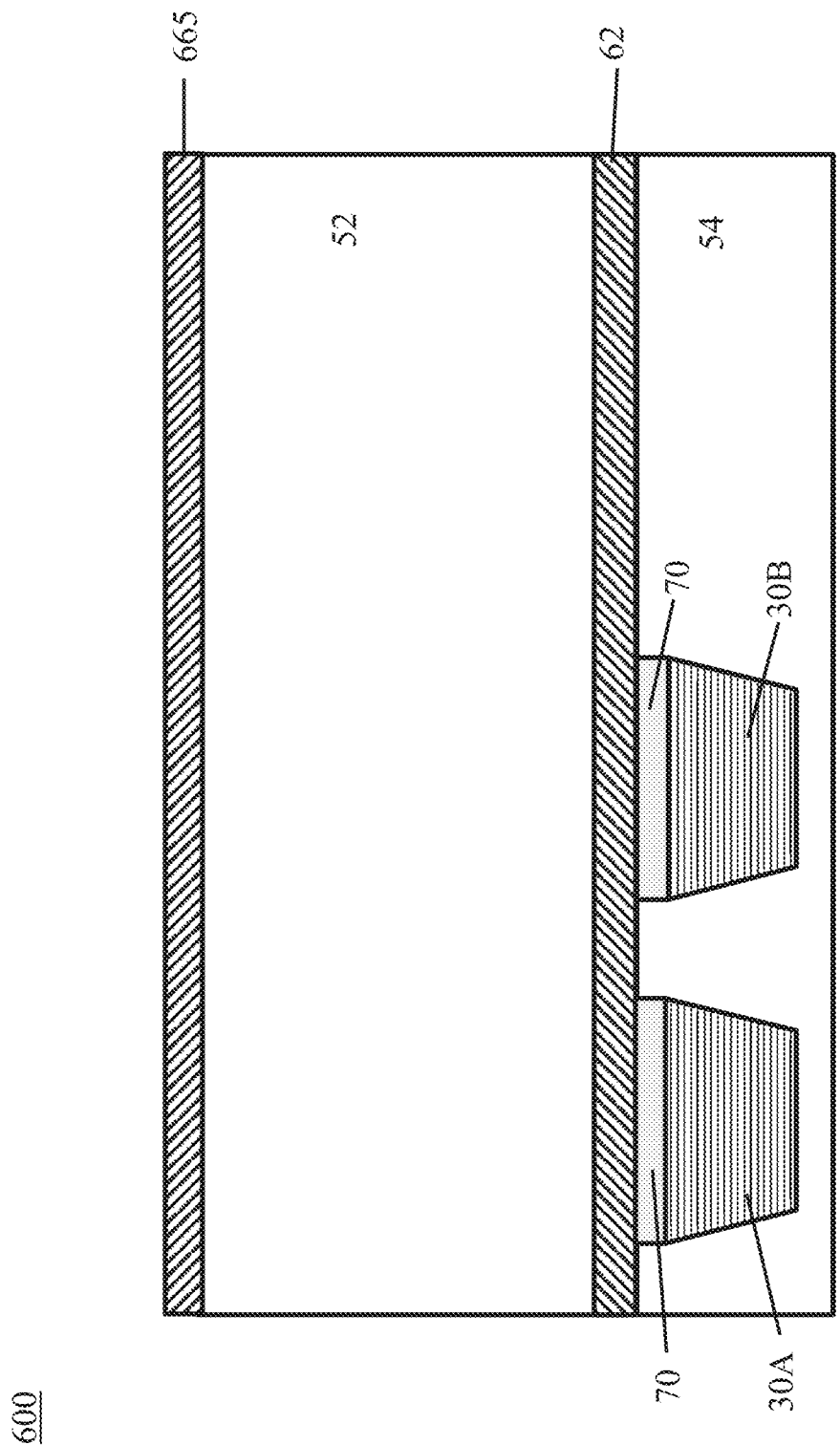
FIG. 6 shows one preferred prior art layered structure used to begin various preferred processes for making interconnect structures with an airgap separating vias and electrical connections.

FIG. 6 shows one preferred initial prior art structure 600 used to begin the process of making some preferred structural embodiments of the present invention. This structure 600 (not drawn to scale) comprises the two layers (10A, 10B, reference numbers not shown for clarity), the upper layer dielectric 52, the lower layer dielectric 54 covered by a lower barrier layer 62, and the pair of lower interconnects 30, optionally capped with metal caps 70, as described above. In addition, the upper layer dielectric 52 is covered by an upper hardmask layer 665, e.g. titanium nitride.

Figure 7:
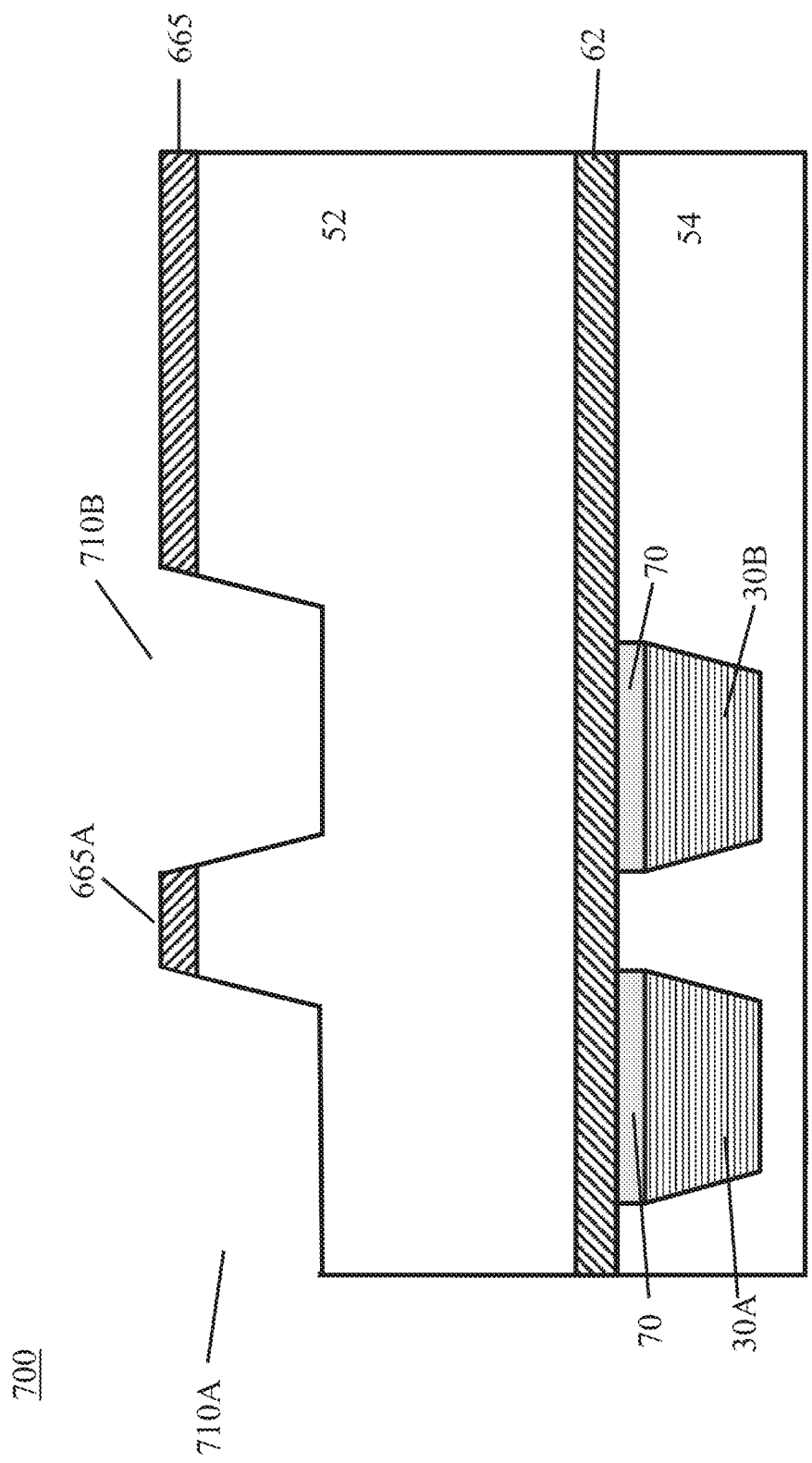
FIG. 7 shows the layered structure of FIG. 6 after a prior art etching step used to prepare for the upper pair of interconnects.

FIG. 7 shows the layered structure of FIG. 6 after a prior art first etching step 700 used to prepare for the upper pair of interconnects 20. The openings 701A and 710B created by the first etching step 700 are separated by a "peak" topped by a portion 665A of the upper hardmask layer 665.

Figure 8:
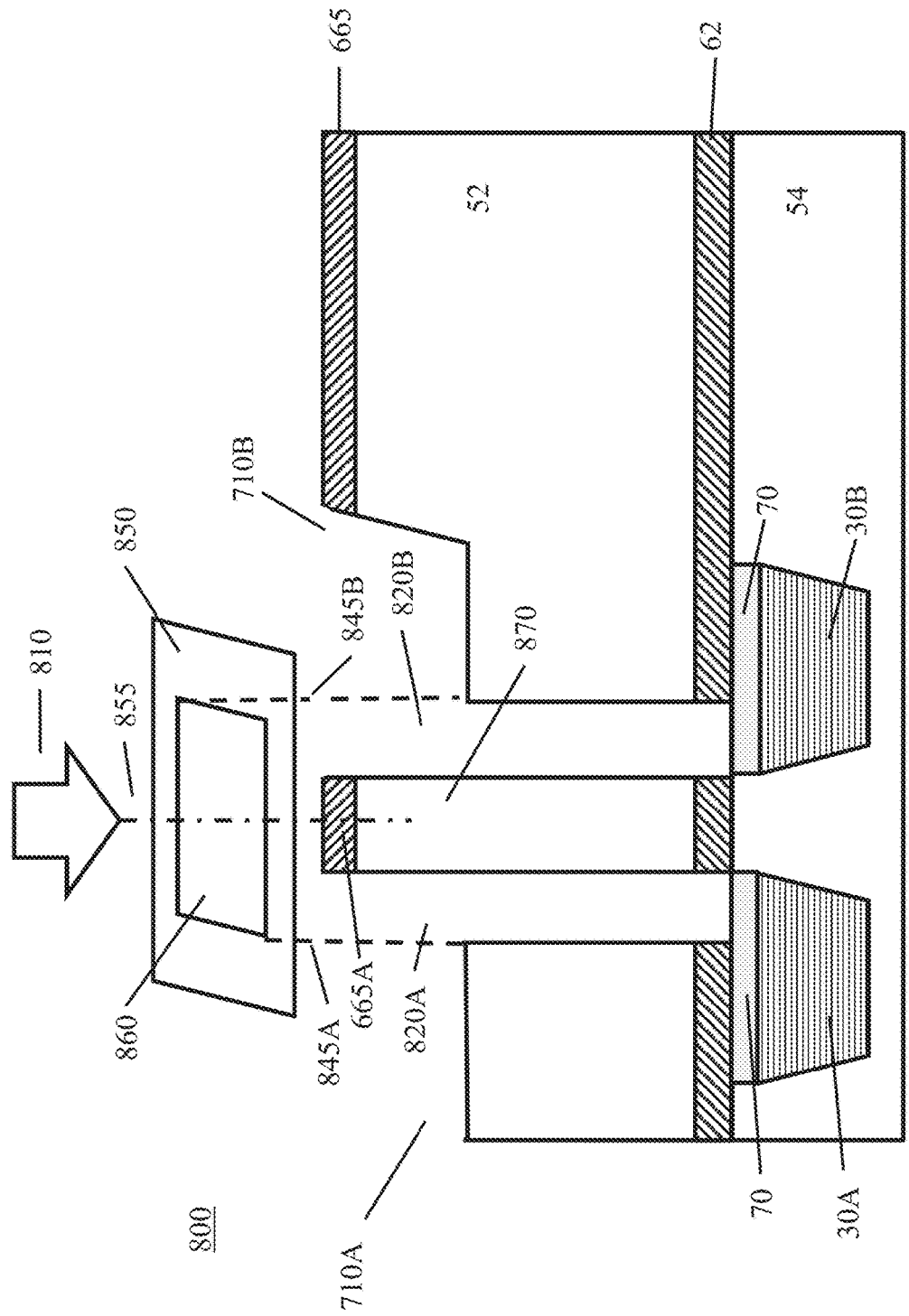
FIG. 8 shows a prior art step of etching the layered structure of FIG. 7 to form the via pairs, where the channels for both vias in the pair can be etched at the same time with a single opening in a reusable via pair mask.

FIG. 8 shows a prior art etch step 800 performed after step 700 to form both via channels (820A, 820B) for both vias (40A, 40B) in the via pair 40. A via pair in this context is a set of nearby vias that can be opened up using only one opening on a mask. Regular vias on the other hand require one opening per each via.

Both channels 820, the first via channel 820A and the second via channel 820B are etched at the same time. A single rectangular via pair mask opening 860 (via pair opening) in via pair mask 850 is used to pattern the opening in the via photoresist. Reactive ion etching (RIE) plasma 810 passes through this via resist opening to create the via channels 820. Dielectric column 870 of dielectric 52 is protected from the RIE process by the portion 665A of the upper metal hardmask layer 665. In a preferred embodiment, the via pair mask opening 860 is sized to a dimension and aligned (e.g. centered at the column 870) so that the vias channels (820A, 820B) are the same cross section within a tolerance and have the column 870 as their center, within a tolerance. The dimensions of the via pair mask opening 860 are such so that when the via pair mask opening 860 is centered over the column 870, the edges of the via pair mask opening 860 create a projection (845A, 845B) that defines the sides of the first 820A and second 820B via channels, respectively.

Via pair mask opening 860, can be used again in further etching processes 1200, described below.

Figure 9:
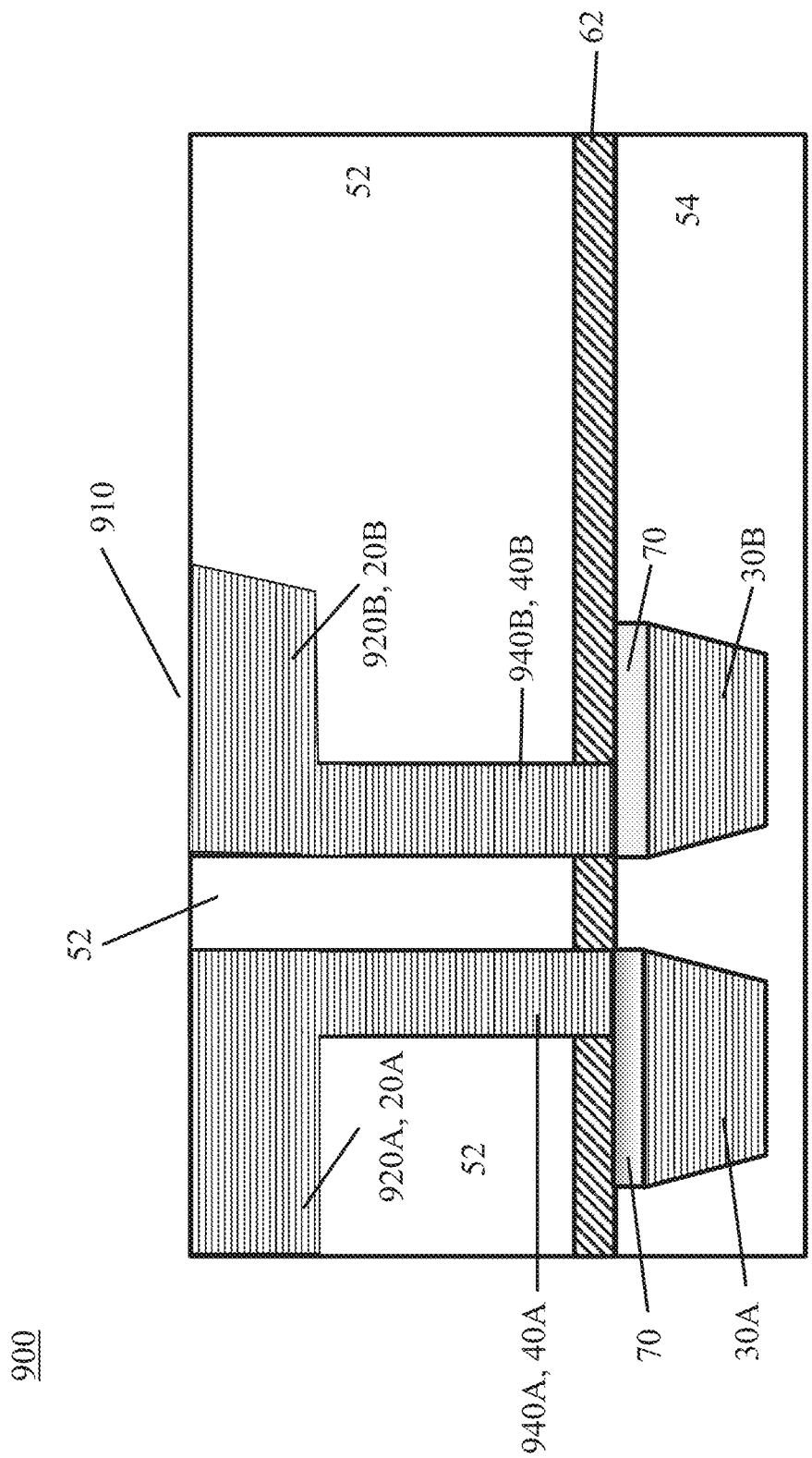
FIG. 9 shows the prior art step of depositing metal (e.g. copper) followed by chemical-mechanical polishing to form the pair of vias and the upper pair of interconnects to electrically and mechanically connect to the respective sides of the lower pair of interconnects to form electrical connections, e.g. conductive paths.

FIG. 9 shows the prior art steps 900 of depositing metal (e.g. copper and refractory liners such as tantalum, tantalum nitride, cobalt, ruthenium) and then chemically mechanically polished (CMP) 910 to remove the over burden to form (920A, 920B) the pair of vias 40 and form (940A, 940B) the upper pair of interconnects 20 that electrically and mechanically connect to the respective lower interconnects 80 to form electrical connections 80, e.g. conductive paths 80.

Figure 10:
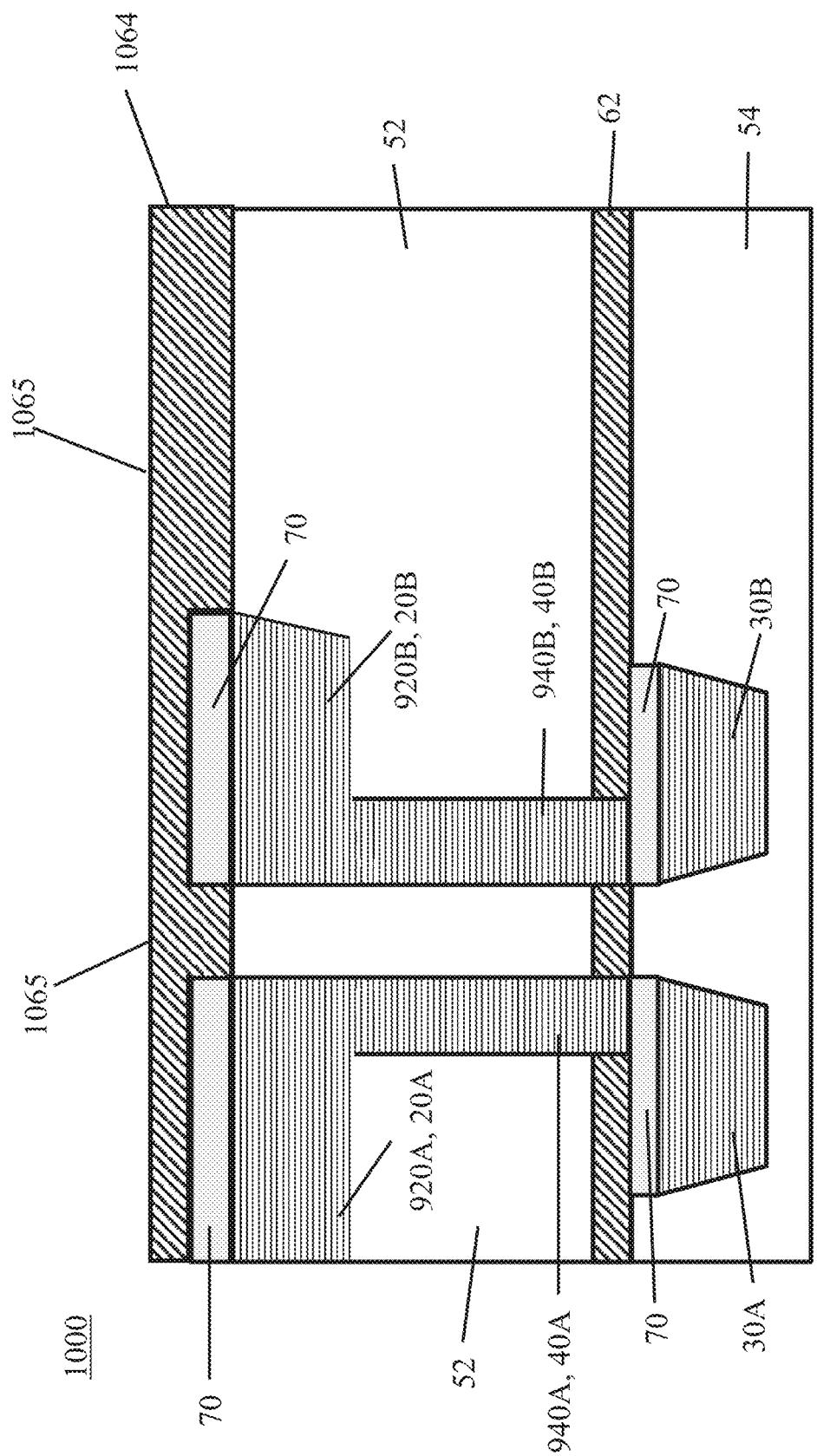
FIG. 10 shows the prior art step of adding metal caps to the upper pair of interconnects and then adding a diffusion barrier.

FIG. 10 shows the prior art step 1000 of adding metal caps 70 to the upper pair of interconnects (20) and then adding a diffusion barrier layer 1064 over the top of the entire structure made by process step 1000. The metal caps 70 are added by electroless deposition. The metal caps 70 only adhere to the metal (e.g. copper) 920 beneath and sit proud of the surface of the upper layer dielectric 52. The diffusion barrier 1064 is disposed conformally to the resulting surface causing a non-uniform thickness 1065 on the surface areas not covered by the metal caps 70. The non-uniform thickness 1065 of the diffusion barrier 1064 will not be shown on later Figures for clarity.

Figure 11:
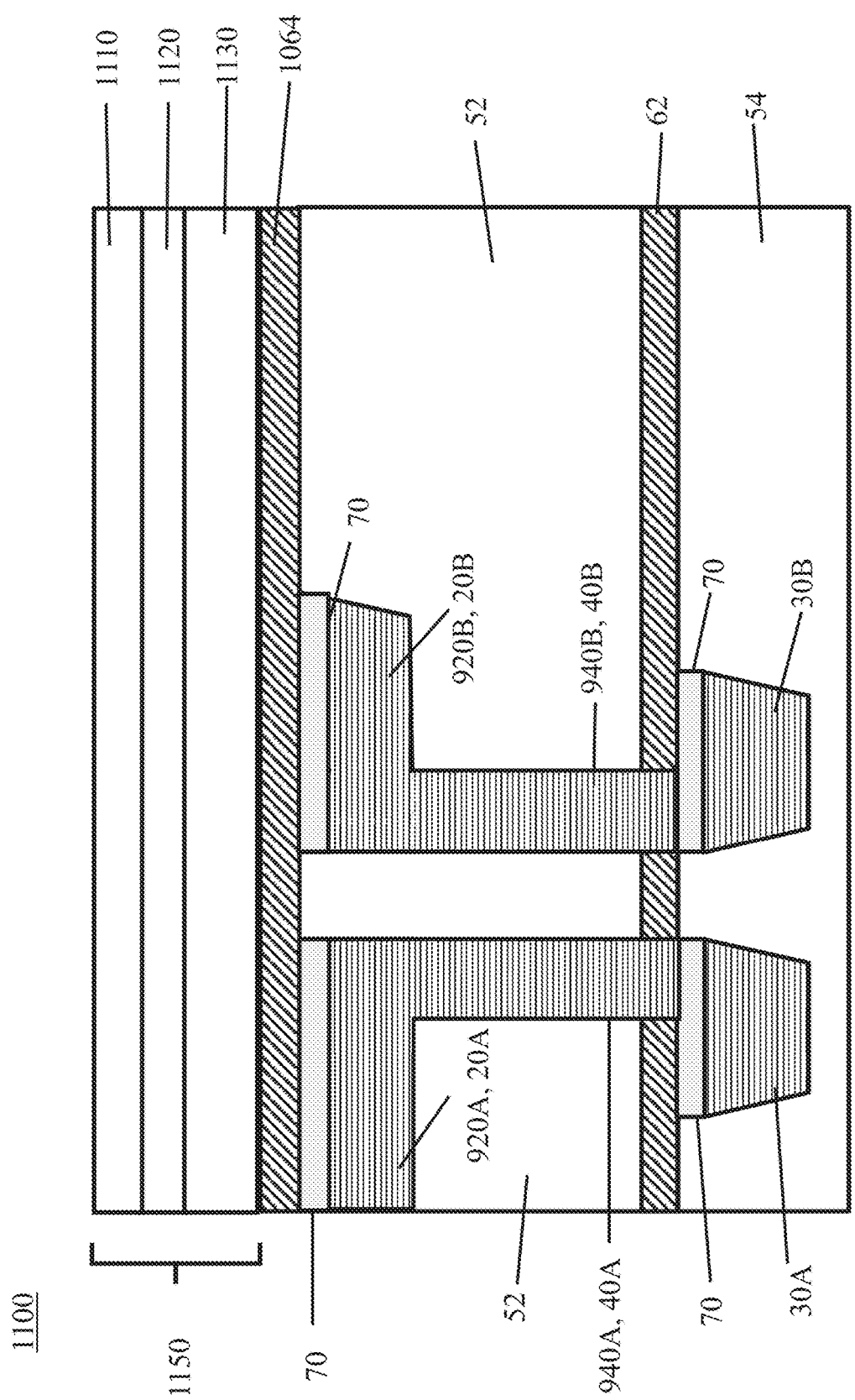
FIG. 11 shows the step of adding a stack of lithographic materials to the structure in FIG. 10.

FIG. 11 shows the step 1100 of adding a stack 1150 of lithographic materials to the structure made by the process 1000 in FIG. 10. The stack comprises an optical planarization layer (OPL) 1130 disposed on the diffusion barrier layer 1064, an antireflective layer 1120 disposed on the OPL, and a layer of resist 1110 disposed on the antireflective layer 1120.

The resist layer 1110 has characteristics that change when exposed to light and/or radiation of other high frequencies. Some of these changes include changes of the solubility of the resist in developing solutions. After the resist layer 1110 is exposed to radiation through a mask, a pattern is created in the resist 1110 which includes areas that have been exposed and areas that have not. The developer solution removes one of these areas, creating places with no resist (holes) and other places with resist (islands) consistent with the pattern, e.g. to be transferred to the underlying structure in later processing steps.

The anti-reflective layer 1120 comprises a material that prevents back scattering of light or other radiation, e.g. by constructive interference, to prevent non-uniform exposure to the under side of the resist layer 1110 during exposure to radiation. In a preferred embodiment, the anti-reflective layer 1120 is a Silicon containing Anti-Reflective Coating (SiARC.)

The OPL 1130 acts to planarize the surface so as to provide greater accuracy in photolithography processes.

Figure 12:
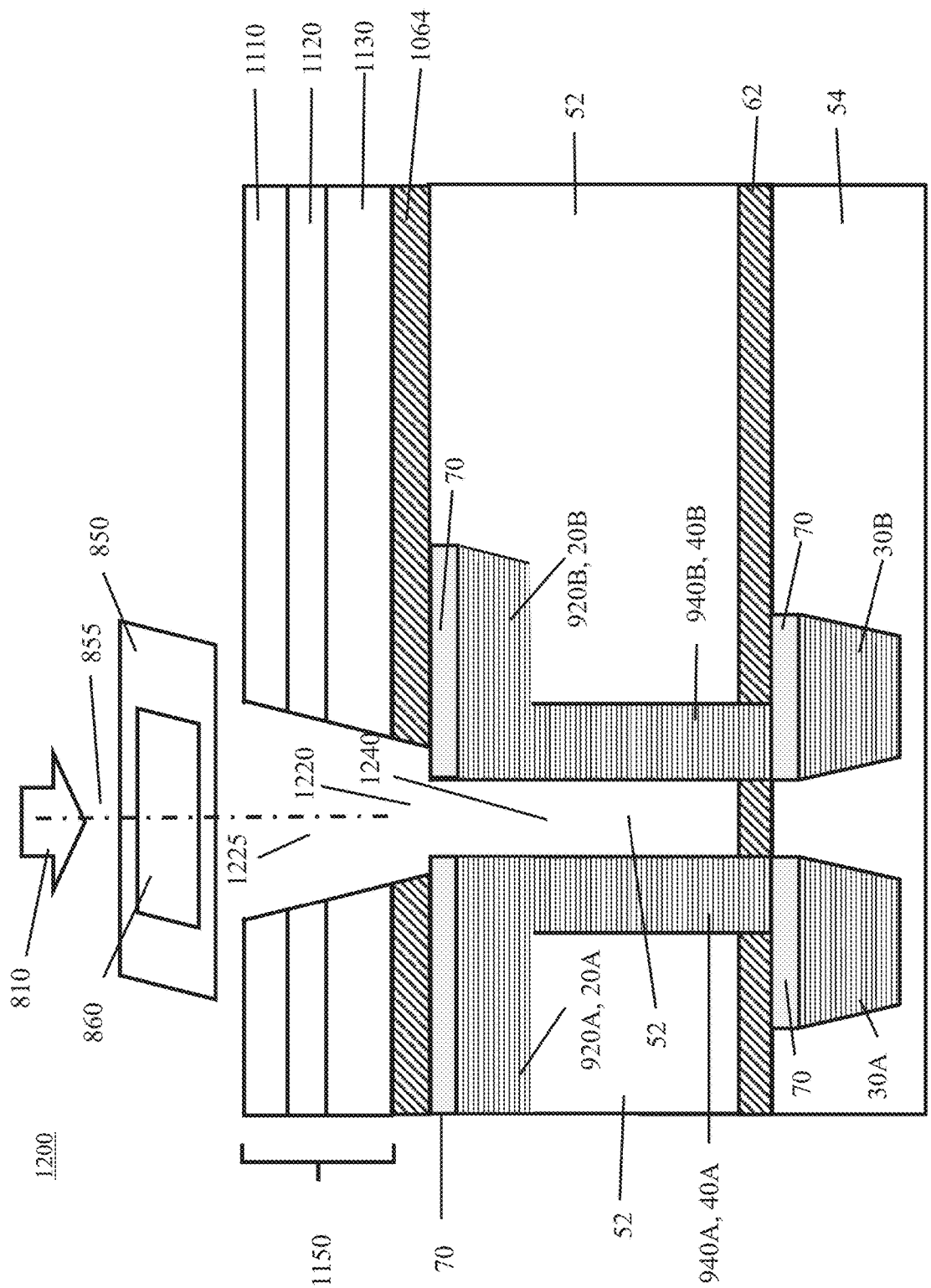
FIG. 12 shows removal of a section of the lithographic stack of materials to expose and remove the dielectric filled volume between the vias by a use of the same via pair mask as in FIG. 8 and by an etch process.

FIG. 12 shows one embodiment of a gap etching process 1200 of a section 1225 of the lithographic stack of materials 1150 including part of the diffusion barrier layer 1064 to expose the dielectric filled volume between the vias 40. The mask used for the gap etch, step 1200, can be achieved by the same via pair mask used in step 800. Alternatively, if regular via and via pair masks 850 are combined in one mask, an airgap mask to be used at this step can be derived by removing all regular via openings from the previous mask and forming a new mask with only the via pair openings.

The metal caps 70 on the upper interconnects have an opening 1220 and there is an opening 1240 between the vias 940. By positioning the same via pair mask 850 over the opening between the vias 1240, the radiation/plasma 810 can pass through the single opening 860 in the via pair mask 850 to remove the dielectric material 52 within the opening 1240 between the vias 940. In a preferred embodiment all the dielectric material 52 within the opening 1240 between the vias 940 is removed. The opening 1220 between the metal caps 70 is aligned with the opening 1240 between the vias 940 and the metal caps 70 act as a mask to protect the regions below them so that a single, uniform volume of dielectric material 52 is exposed to the etching.

In this gap etching process 1200, the process 1200 etches through the dielectric material 52 within the opening 1240. In a preferred embodiment, this etch is a timed etch.

There are alternative preferred options of the gap etching process 1200, described below, to etch at different depths to create and airgap 50 of different lengths. Some of the gap etching uses barrier layers to stop the etch, as described below.

This gap etching process 1200 creates a uniform airgap 50 that is in alignment from the top opening 1220 to the bottom 55 (reference number shown in other Figures) of the airgap 50. As disclosed, the lower center line 76 is colinear with the upper centerline 72 and via centerline 74, e.g. the offset distance 78 approaches zero within a tolerance.

The uniformity of the sides of the airgap 50 creates more precise and determinable distances between the electrical connections 80A and 80B. Therefore, unanticipated short distances between the electrical interconnects 80A and 80B are removed and widths of the airgap 50 can be controlled. Accordingly, the TDDB behavior of the design of the airgap 50 in the embodiments presented is more predictable and the gap widths can be smaller to permit higher densities of via pairs in the interconnect structure.

As discussed in this disclosure, the bottom 55 of the airgap is determined and located in different ways depending on the structure and how this etch process 1200 is performed.

Figure 13:
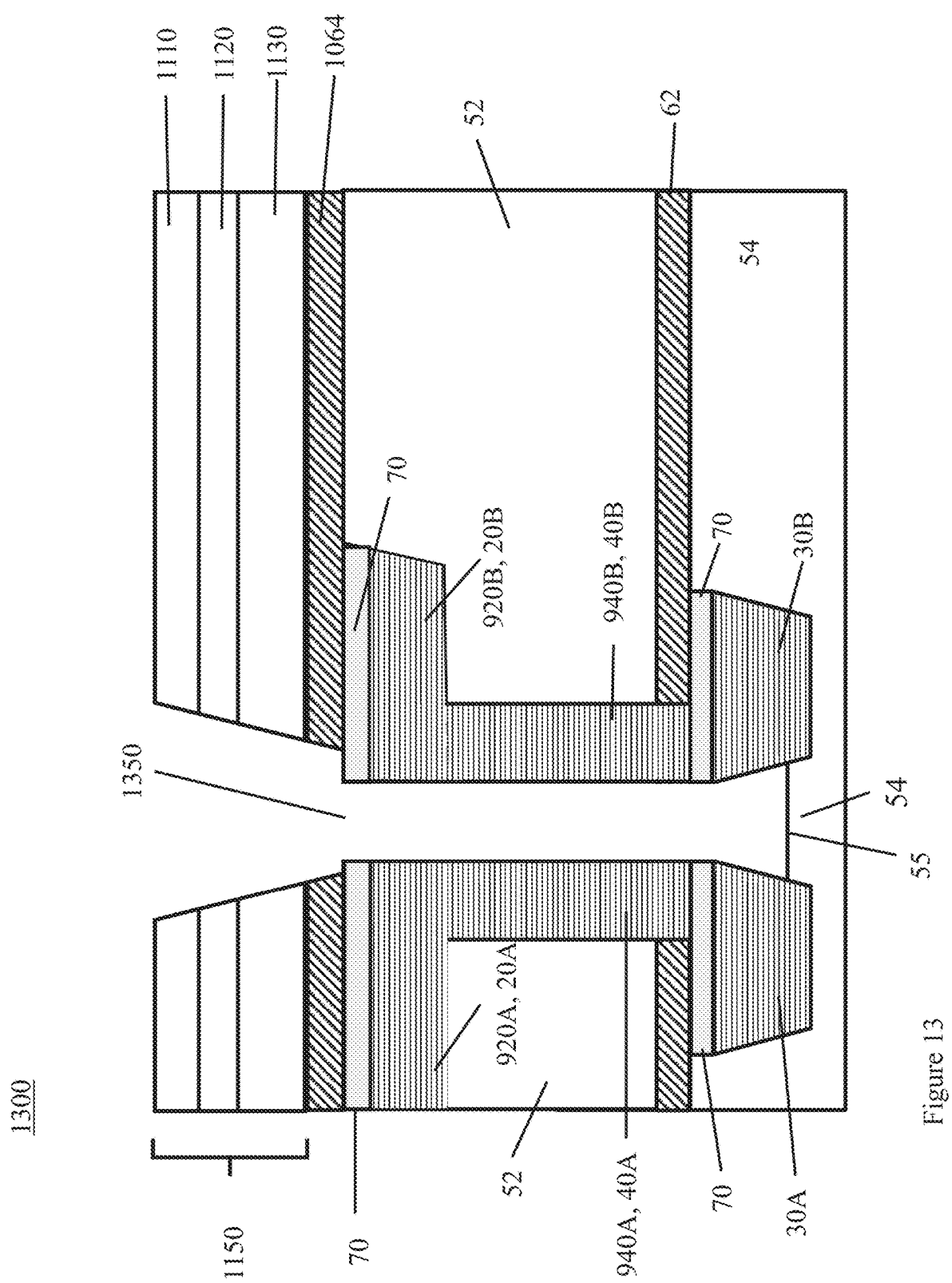
FIG. 13 shows an alternative embodiment 1300 of the etch process 1200 that creates one preferred structure embodiment where the lower center line is colinear with the upper centerline and via centerline and the bottom of the airgap is within the lower layer.

FIG. 13 shows an alternative embodiment 1300 of the gap etch process 1200 that creates one preferred embodiment 200 where the lower center line 76 is collinear with the upper centerline 72 and via centerline 74 (as described in FIG. 12) and the bottom 55 of the airgap 50 is within the lower layer 10B. Here the etching process 1200 etches through the lower barrier layer 62 into the lower layer 10B but not below the bottom of the lower interconnect 30. In a preferred embodiment, this is done with a timed etch 1200 during a time period.

Figure 14:
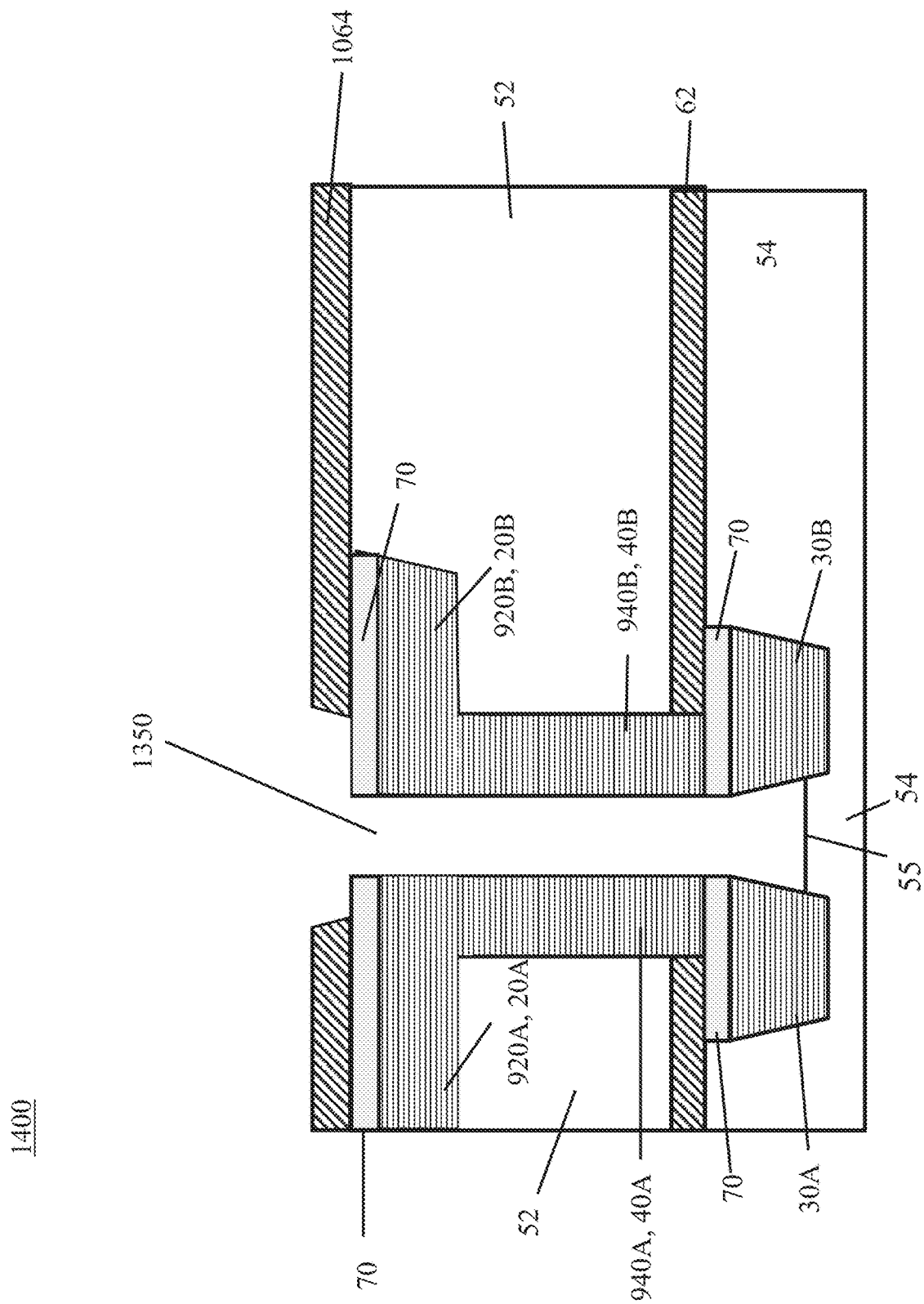
FIG. 14 shows the structure after the removal of the lithographic stack materials.

FIG. 14 shows a step of removing 1400 the remainder of the lithographic stack 1150 of materials. This is done by standard chemical processes.

Figure 15:
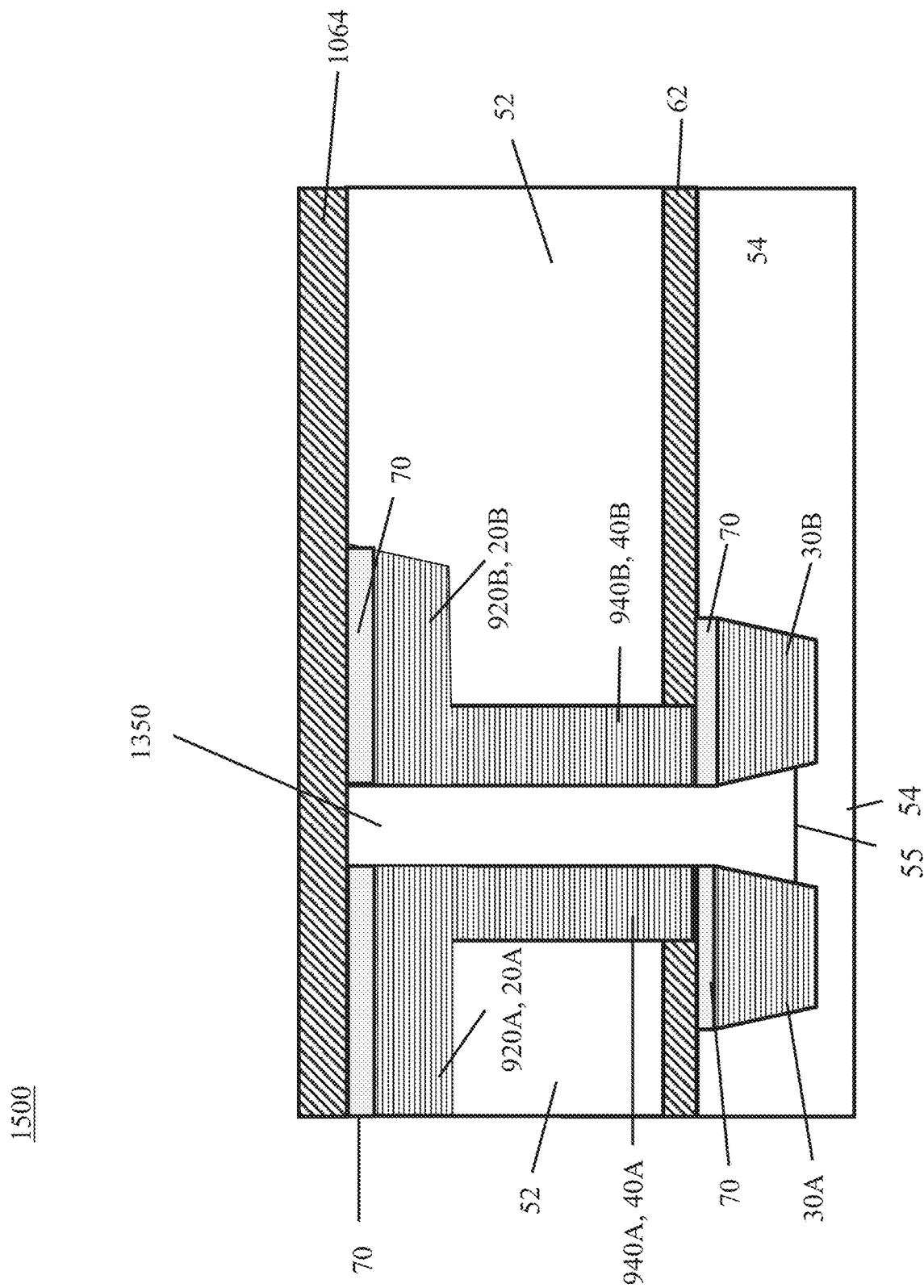
FIG. 15 shows a step of redepositing a diffusion barrier (e.g. NBLoK or SiN) to close off the top of the airgap, which in this embodiment the airgap extends into the dielectric of the lower layer, as shown in the structure of FIG. 2.

FIG. 15 shows a step of redepositing 1500 a diffusion barrier layer 1064 to close off the top 1350 of the airgap 50. In this embodiment, the airgap 50 extends into the dielectric of the lower layer 10B, as shown in the structure 200 of FIG. 2.

The diffusion barrier layer 1064 can comprise either NBLoK or SiN. The top of the diffusion barrier layer 1064 will not be perfectly flat (not shown) in some embodiments because it is conformally applied and the upper metal caps 70 sit a bit proud of the dielectric 52. Therefore, there may be some deviation of the elevation of the surface of diffusion barrier layer 1064 on the order of the thickness of the upper metal cap 70 thickness.)

Figure 16:
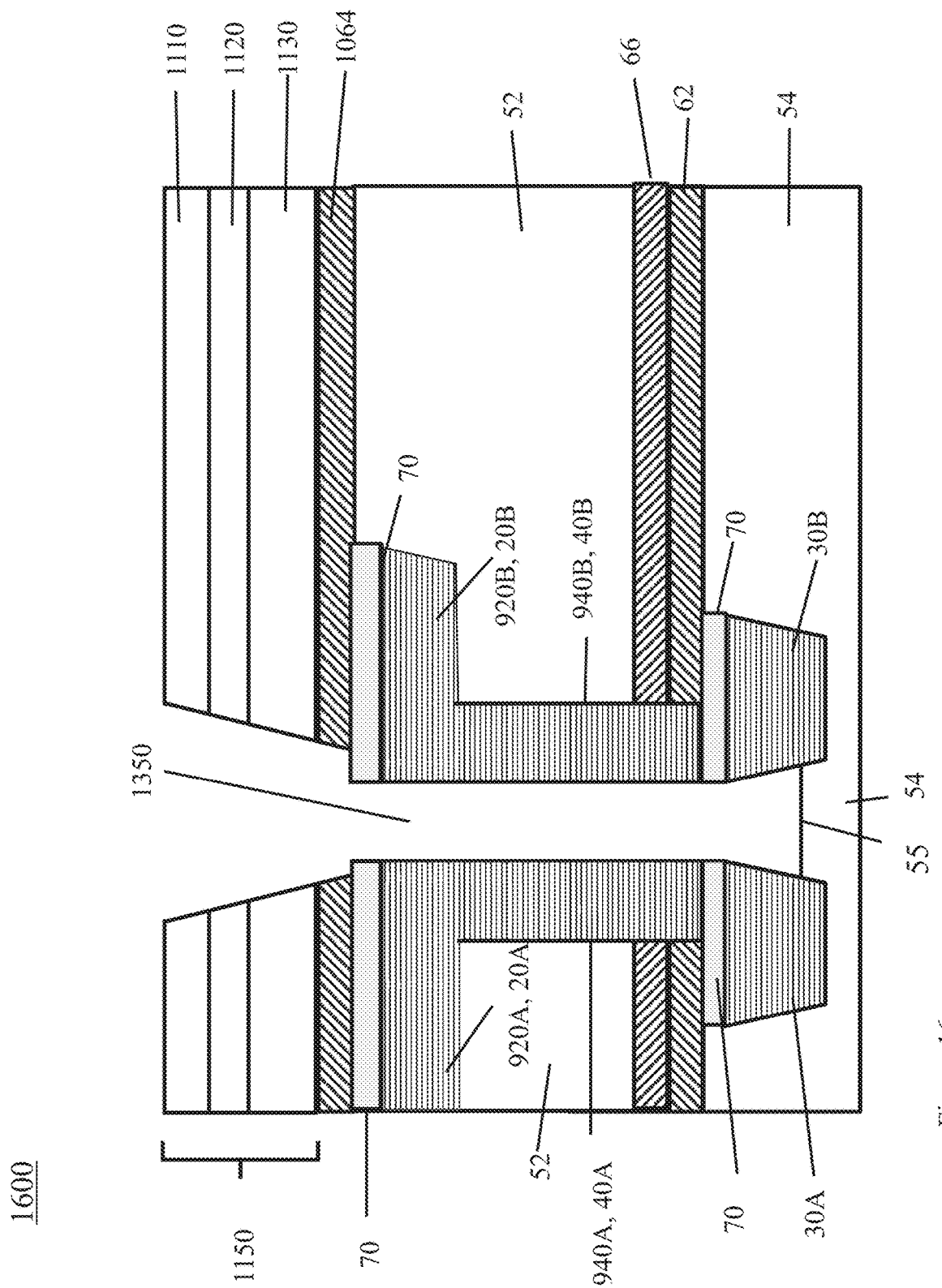
FIG. 16 shows an alternative embodiment of the etch process that etches through a dielectric hardmask to create an airgap with a bottom that extends into the dielectric of the lower layer.

FIG. 16 shows an alternative embodiment 1600 of the gap etch process 1200 that etches through a dielectric hardmask 66 to create an airgap 50 with a bottom 55 that extends into the dielectric 54 of the lower layer 10B. In this embodiment, the dielectric hardmask 66 was disposed on the lower barrier layer 62 during the formation of the lower layer 10B. To achieve this structure 300 (see FIG. 3), in a preferred embodiment 1600, the etch process 1200 is performed in two steps. First the etch is performed to remove the material in the opening 1250 down to the top of the hardmask 66. The hardmask 66 gives an exact stopping location for the first step of this embodiment of the etching process 1200. The second step of the etching process 1200 of this embodiment etches through the hardmask 66 and into the lower layer 10B, below the tops of the lower pair of interconnects 30. The second step of the etching process 1200 of this embodiment can using different chemicals or etching methods depending on the selection of the materials in the hardmask 66 and can be a timed etch. Performing this two-step embodiment of the etching process 1600 gives a more accurate control of the etching process and more accurate placement of the bottom 55 of the airgap 50. The airgap 1350 is created.

Figure 17:
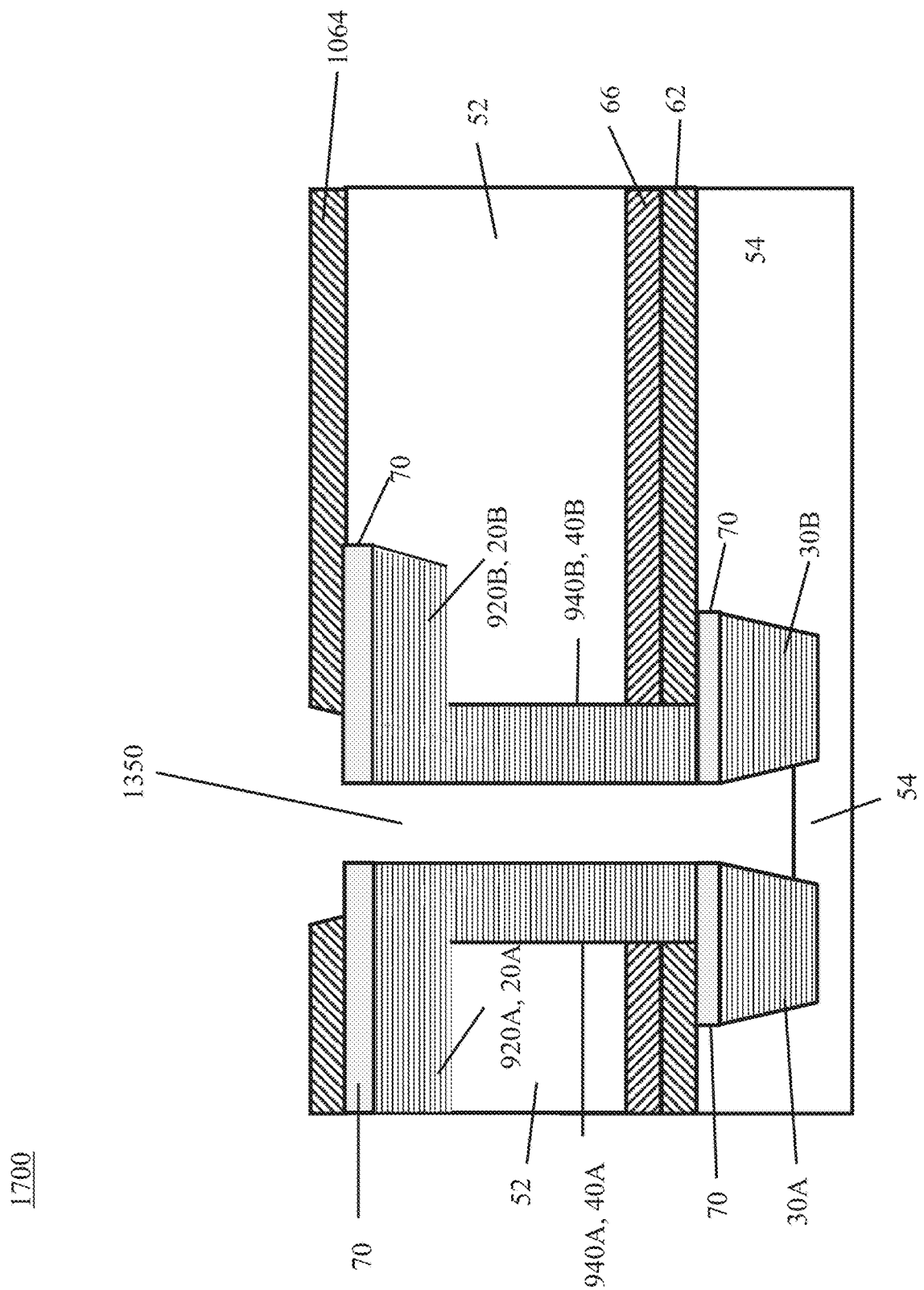
FIG. 17 shows a step performed after step 1600 in FIG. 16 that removes the lithographic stack of materials.

FIG. 17 shows a step performed after step 1600 in FIG. 16 that removes 1700 the lithographic stack of materials using known chemicals and techniques.

Figure 18:
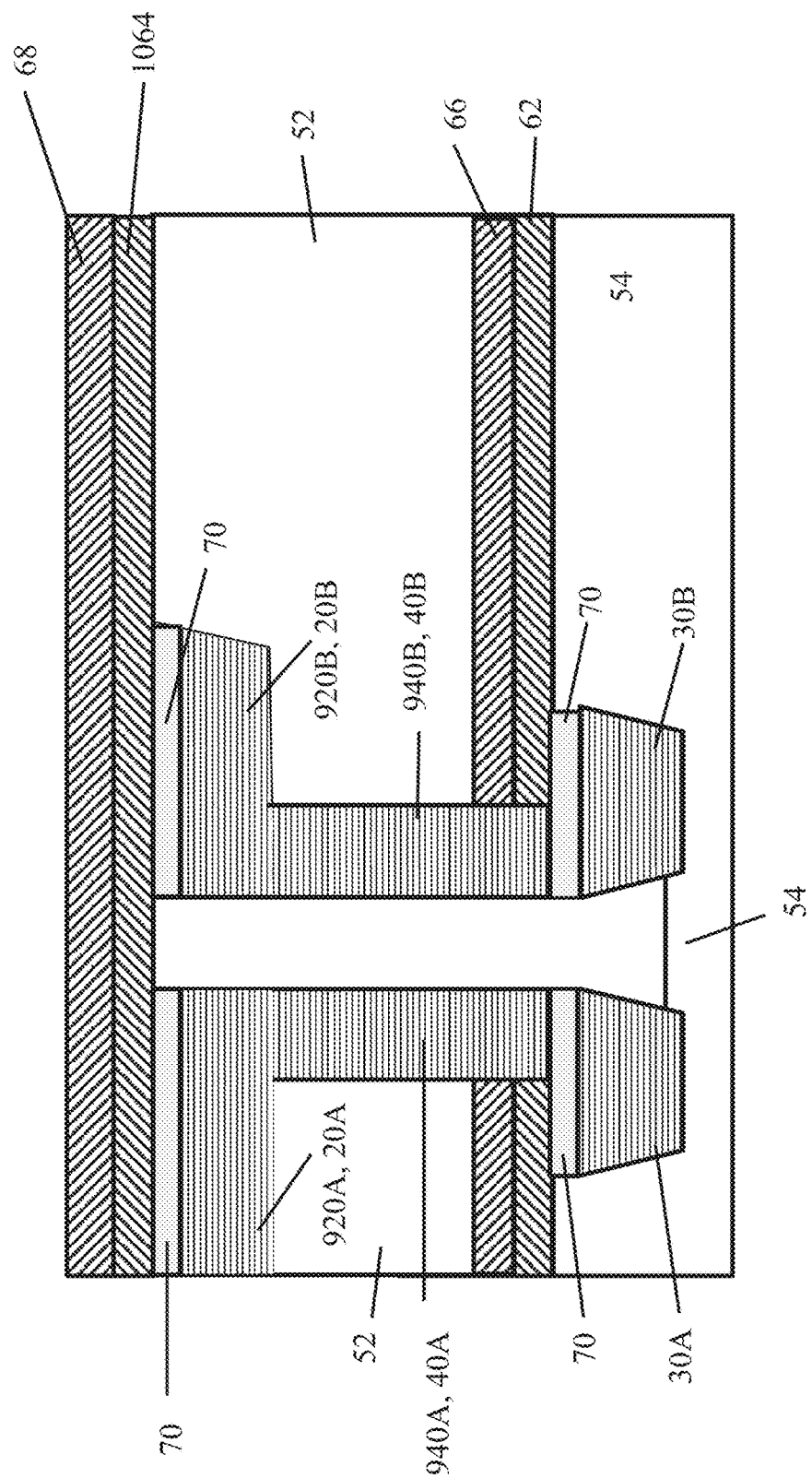
FIG. 18 shows the steps of redepositing a diffusion barrier and etch stop layer (e.g NBLoK or SiN) to close off the top of the airgap in this alternative process embodiment, e.g.

FIG. 18 shows the steps of redepositing 1800 a diffusion barrier 1064 (e.g. NBLoK or SiN) and hardmask layer 68 to close off the top 1350 of the airgap 50. This alternative process 1800 embodiment, included within the explanation of FIGS. 16-18, extends the bottom 55 of the airgap 50 into the lower layer dielectric 54, as shown in the structure 300 of FIG. 3, but not below the bottom of the lower interconnects 30.

Figure 19:
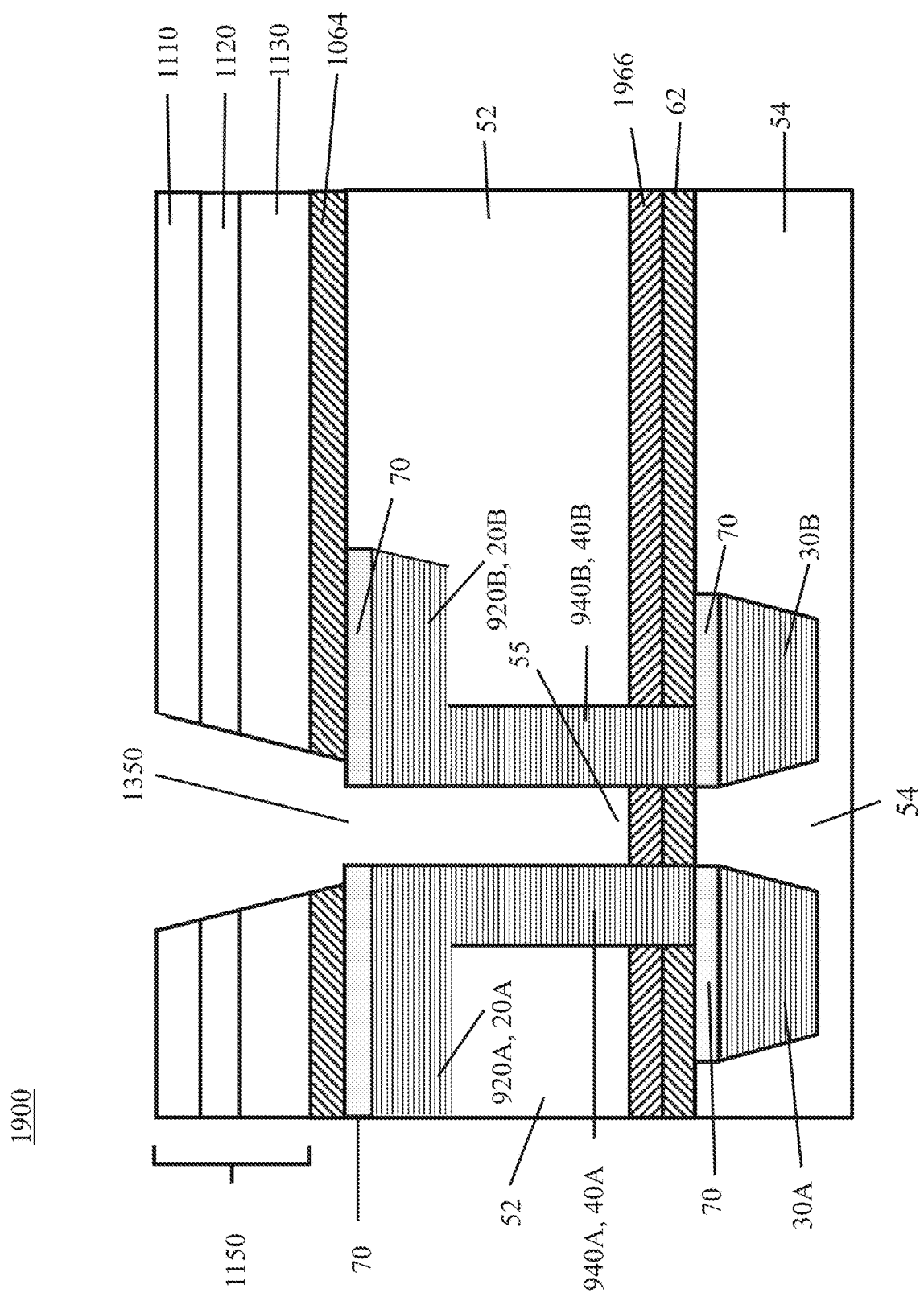
FIG. 19 shows a step of using a hardmask as a stop for the etch process to keep the bottom of the gap within the upper layer, as shown in the structure of FIG. 4.

FIG. 19 shows an alternative etch process 1900 of process 1200 of using a hardmask 1966 as a stop for the etch process 1200 to accurately keep the bottom 55 of the gap 50 within the upper layer 10A, as shown in the structure 400 of FIG. 4. The hardmask 1966 was disposed on the lower barrier layer 62 before deposition of the upper layer dielectric 52. The bottom 55 of the airgap 50 is accurately placed at the top of the hardmask 1966 and does not penetrate the lower dielectric 54. There is only one etch 1200 performed in this embodiment.

Figure 20:
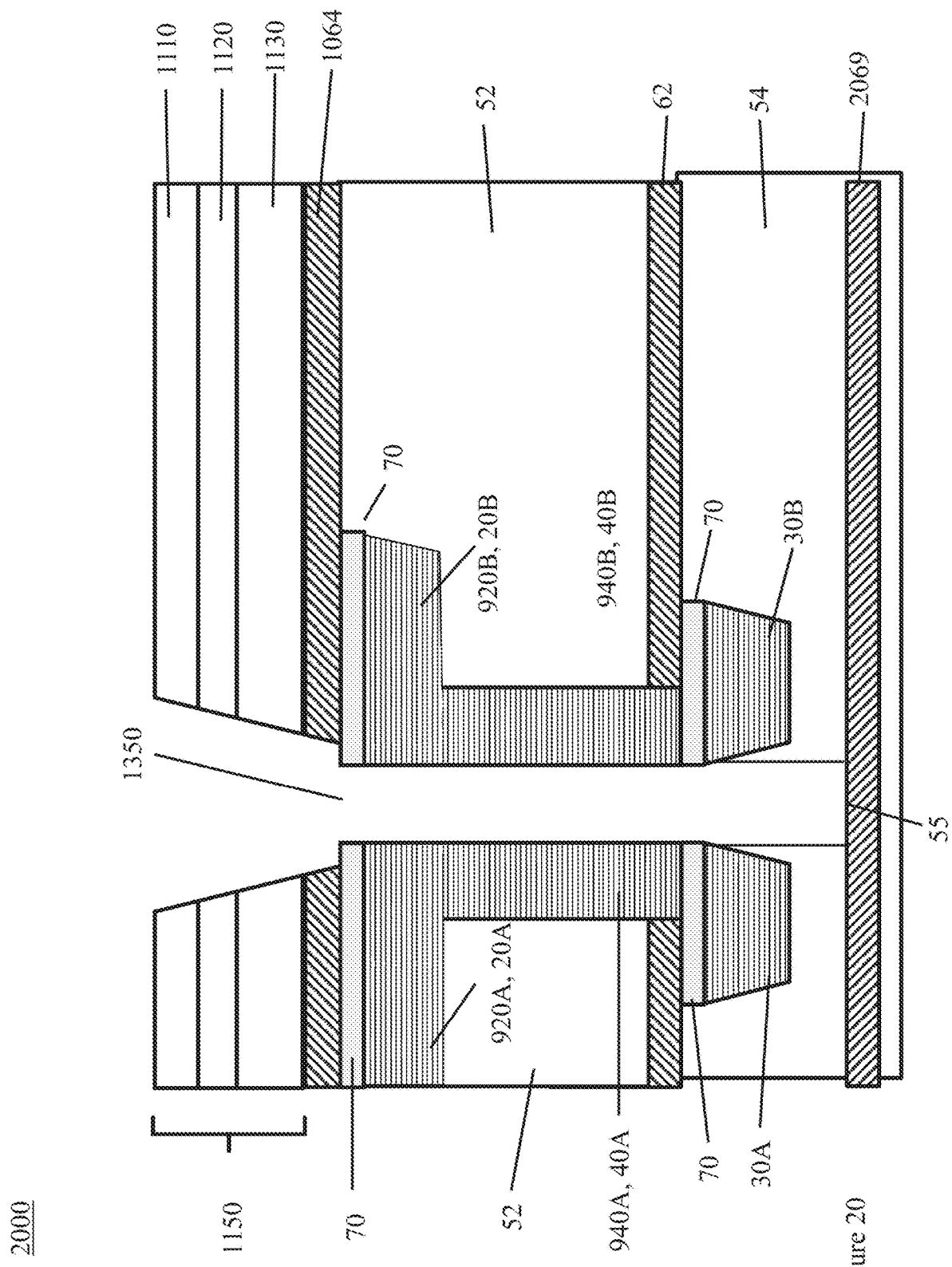
FIG. 20 shows a step of using a hardmask as a stop for the etching process to accurately place the bottom of the gap below the bottom of the lower interconnect pair and into the lower dielectric as shown in the structure of FIG. 5.

FIG. 20 shows a step 2000 of using a bottom hardmask 2069 as a stop for the etching process 1200 to accurately place the bottom 55 of the gap 50 below the bottom of the lower interconnect pair 30 and into the lower layer dielectric 54 as shown in the structure 500 of FIG. 5. The bottom hardmask 1966 can be placed within the lower layer dielectric 54 as the lower layer dielectric is being formed.

We claim:

1. A method of making an interconnect structure, comprising the steps of:

first etching a pair of channels for a pair of upper interconnects in an initial structure, the initial structure being a layer pair having an upper layer and a lower layer, the upper layer comprising an upper dielectric, and the lower layer comprising a lower dielectric, an upper hardmask layer over the upper dielectric, a first and second lower interconnect, being a pair of lower interconnects within the lower dielectric and being separated by a lower separation distance, the lower separation distance having a lower centerline, a lower metal cap present on each lower interconnect, and a lower barrier layer present on and in contact with the lower metal caps and the lower dielectric and chemically and electrically isolating the upper dielectric from the lower metal caps and the lower dielectric, the first etching going through the upper hardmask layer and into part of the upper dielectric but leaving a peak of upper dielectric capped with a peak portion of the upper hardmask layer, the peaked portion being in a vertical alignment with the lower centerline;

a second etching through a single window through a via pair mask, the single window in the vertically alignment and centered on the peaked portion, the second etching simultaneously creating a pair of via channels that are open from the respective channels in the pair of channels to a top of the respective lower metal caps, and the upper dielectric under the peaked portion being unetched;

depositing a conductive material to fill the pair of channels and via channels to form a pair of upper interconnects and a pair of vias, the vias mechanically and electrically connected to the top of the respective lower metal caps;

depositing an upper metal cap on each of the upper interconnects, an upper gap between the upper metal caps having an upper center line colinear with the lower centerline;

depositing a diffusion barrier layer on the initial structure covering the upper metal caps and the upper dielectric;

depositing a lithographic stack on the diffusion barrier layer; and etching with a first gap etch process through the single window, the lithographic stack, and the diffusion barrier layer to create an airgap between the pair of vias by etching all the upper dielectric between the vias and the upper interconnects, the airgap having a gap centerline colinear with the upper and lower centerlines.

2. A method, as in claim 1, where the first gap etch process is terminated after a first timed period.

3. A method, as in claim 1, where a lower hardmask is disposed on the lower barrier layer and the first gap etch process terminates when a gap bottom reaches the lower hardmask.

4. A method, as in claim 1, where a bottom hardmask is present within the lower dielectric below the lower interconnects and the first gap etch process terminates when a gap bottom reaches the bottom hardmask.

5. A method, as in claim 1, where a lower hardmask is present on the lower barrier layer and the first gap etch process terminates when an airgap bottom reaches the lower hardmask and further comprising a second gap etch process by etching a second time through the lower hardmask and the lower barrier layer into the lower dielectric.

6. A method, as in claim 5, where the second gap etch process terminates after a second timed period.

7. A method, as in claim 1, where the first gap etching process uses a derived mask consisting only of the via pair mask opening to vertically align the etching.

8. A method, as in claim 1, done in a vacuum and where the airgap contains a vacuum.

9. A method, as in claim 1, where a projection of the via pair mask defines one or more sides of each of a first and a second via channels in the pair of via channels.

10. A method, as in claim 9, where the single window of the via pair mask is centered on the peaked portion to create the same cross section area for the first and second via channels.

11. A method, as in claim 1, where the deposited conductive material filling the pair of channels and via channels is one or more of the following: copper, a refractory, tantalum, tantalum nitride, cobalt, and ruthenium.

12. A method, as in claim 1, where the upper metal caps on each of the upper interconnects are deposited by electroless deposition.

13. A method, as in claim 1, where the upper metal caps do not adhere to the upper dielectric.

14. A method, as in claim 1, where the upper metal caps sit proud of the upper dielectric.

15. A method, as in claim 1, where the first gap etch process makes one or more of the sides of the airgap uniform.

16. A method, as in claim 1, where the first gap etch process ends when a gap bottom is within the lower dielectric but not below a bottom of the lower interconnect.

17. A method, as in claim 16, where the first gap etch process ends when the gap bottom is lower than the bottom of the lower interconnect by at least 5 nanometers (nm).

18. A method, as in claim 17, where the top barrier layer is made of one of NBLoK and SiN.

19. A method, as in claim 1, where a top barrier layer is deposited to close off a top of the airgap.

20. A method, as in claim 1, where the lower separation distance is between 5 nm and 100 nm.

* * * * *